United States Patent
Rhee

(10) Patent No.: US 9,846,510 B2
(45) Date of Patent: Dec. 19, 2017

(54) DISPLAY APPARATUS USING SEMICONDUCTOR LIGHT EMITTING DEVICE

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 79 days.

(21) Appl. No.: 15/034,158

(22) PCT Filed: Oct. 30, 2014

(86) PCT No.: PCT/KR2014/010312
§ 371 (c)(1),
(2) Date: May 3, 2016

(87) PCT Pub. No.: WO2015/072685
PCT Pub. Date: May 21, 2015

(65) Prior Publication Data
US 2016/0313848 A1    Oct. 27, 2016

(30) Foreign Application Priority Data

Nov. 18, 2013    (KR) .................. 10-2013-0140036

(51) Int. Cl.
*G06F 3/041*    (2006.01)
*G06F 3/044*    (2006.01)
(Continued)

(52) U.S. Cl.
CPC .......... *G06F 3/0416* (2013.01); *G02B 5/201* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

2003/0102798 A1    6/2003    Ohnishi
2010/0007616 A1    1/2010    Jang
(Continued)

FOREIGN PATENT DOCUMENTS

WO    2006007071    1/2006
WO    2013/157858    10/2013

OTHER PUBLICATIONS

PCT International Application No. PCT/KR2014/010312, Notification of Transmittal of the International Search Report dated Jan. 27, 2015, 2 pages. European Patent Office Application Serial No. 14862138.6, Search Report dated Jun. 20, 2017, 8 pages.

*Primary Examiner* — Duane N Taylor, Jr.
(74) *Attorney, Agent, or Firm* — Lee, Hong, Degerman, Kang & Waimey

(57) ABSTRACT

The present invention relates to a display apparatus and, more particularly, to a display apparatus using a semiconductor light emitting device. In the display apparatus including a touch sensor unit and a display unit controlled based on a touch input sensed through the touch sensor unit, the display unit includes: a conductive bonding layer; and a plurality of semiconductor light emitting devices bonded to the conductive bonding layer and arranged to form a plurality of rows, and the touch sensor unit includes: an X electrode disposed between the plurality of rows of the semiconductor light emitting devices in the display unit; and an Y electrode configured to be combined with the X electrode to sense a touch input.

12 Claims, 14 Drawing Sheets

(51) Int. Cl.
*G02B 5/20* (2006.01)
*H01L 25/075* (2006.01)
*H01L 33/32* (2010.01)
*H01L 33/42* (2010.01)
*H01L 33/50* (2010.01)
*H01L 33/58* (2010.01)
*H01L 33/62* (2010.01)

(52) U.S. Cl.
CPC .......... *H01L 25/0753* (2013.01); *H01L 33/32* (2013.01); *H01L 33/42* (2013.01); *H01L 33/502* (2013.01); *H01L 33/58* (2013.01); *H01L 33/62* (2013.01); *G06F 2203/04101* (2013.01); *G06F 2203/04102* (2013.01); *G06F 2203/04107* (2013.01); *G06F 2203/04111* (2013.01)

(56) References Cited

U.S. PATENT DOCUMENTS

| | | | |
|---|---|---|---|
| 2010/0187522 A1 | 7/2010 | Lee et al. | |
| 2011/0303930 A1 | 12/2011 | Bang et al. | |
| 2012/0092279 A1* | 4/2012 | Martin | G02B 26/0833 345/173 |
| 2013/0093724 A1* | 4/2013 | Liu | G06F 3/0412 345/174 |
| 2015/0289083 A1* | 10/2015 | Tsai | H04B 5/00 455/41.1 |

* cited by examiner

[Fig. 1]
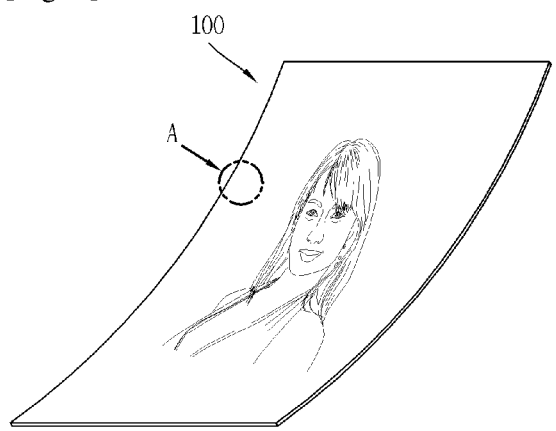
[Fig. 2]
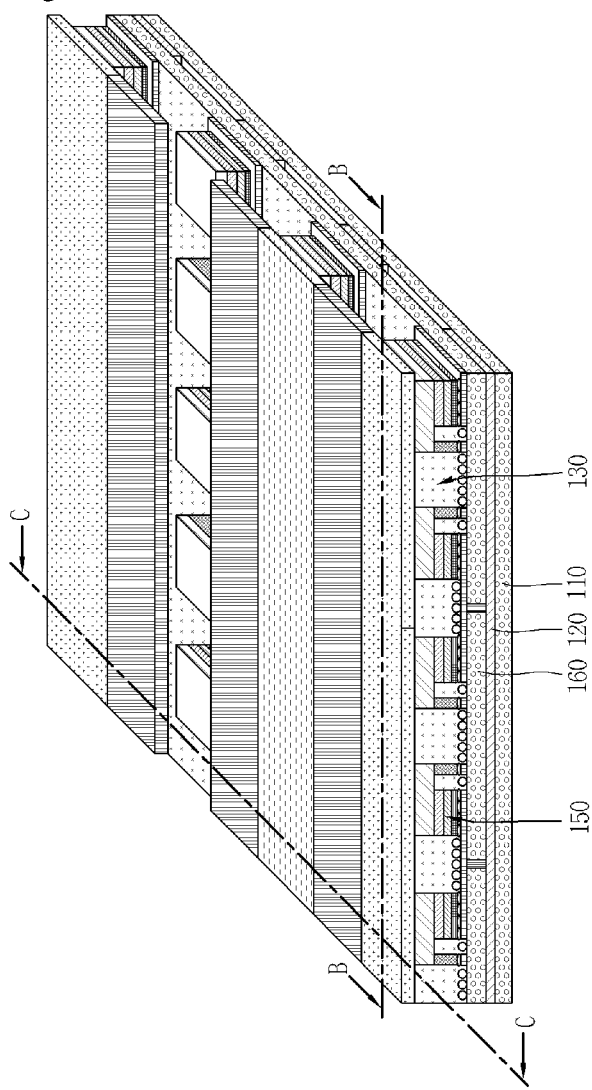

[Fig. 3a]
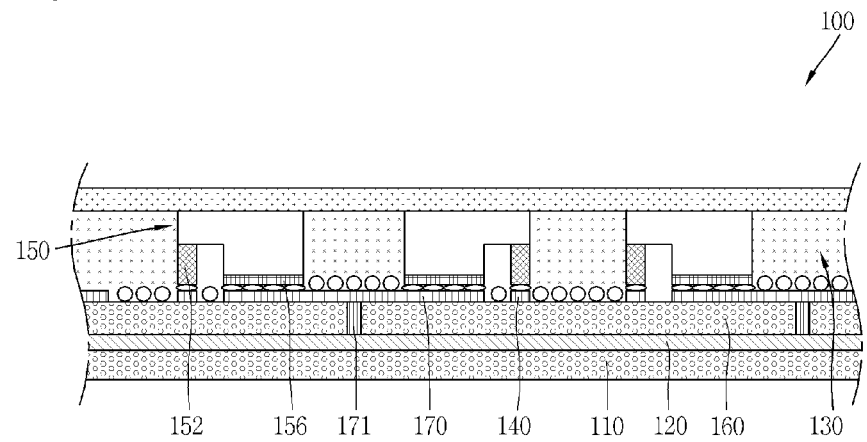
[Fig. 3b]
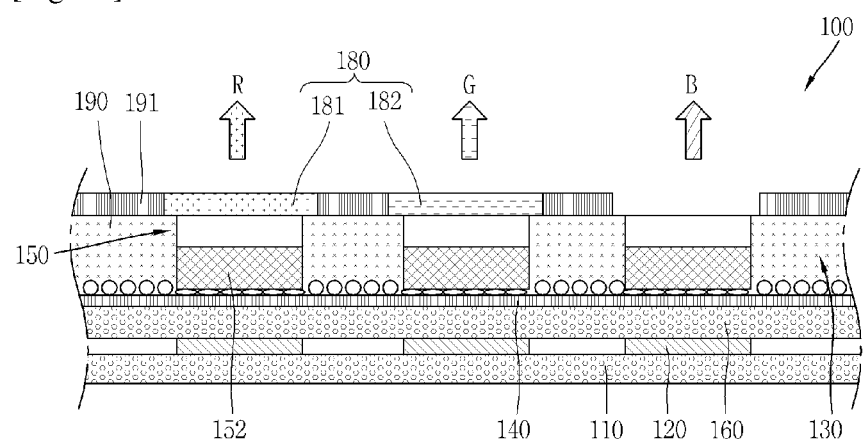
[Fig. 4]
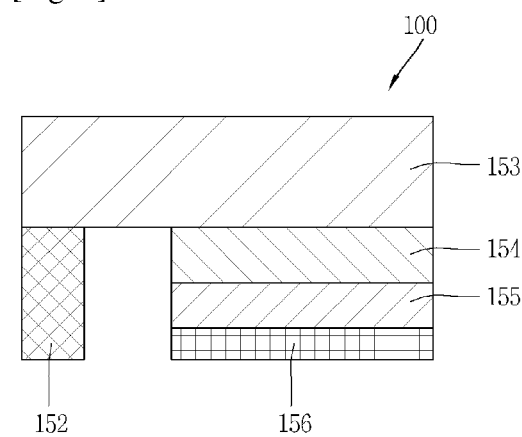
[Fig. 5a]
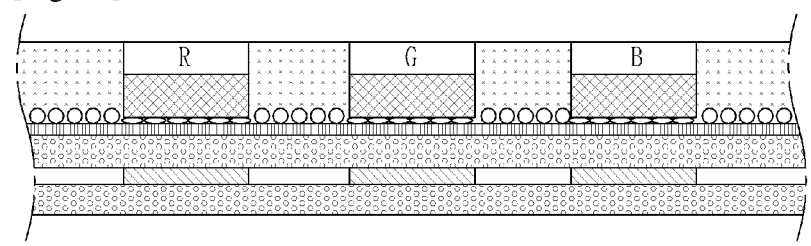

[Fig. 5b]
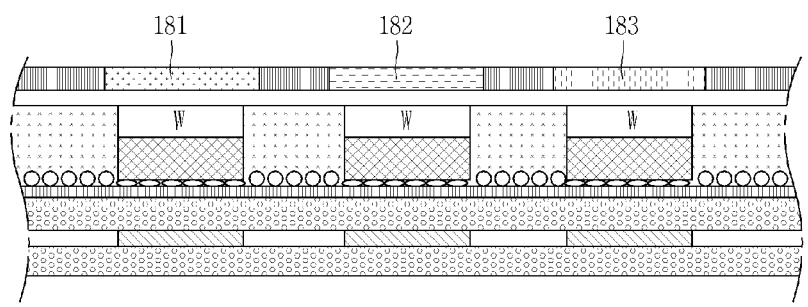
[Fig. 5c]
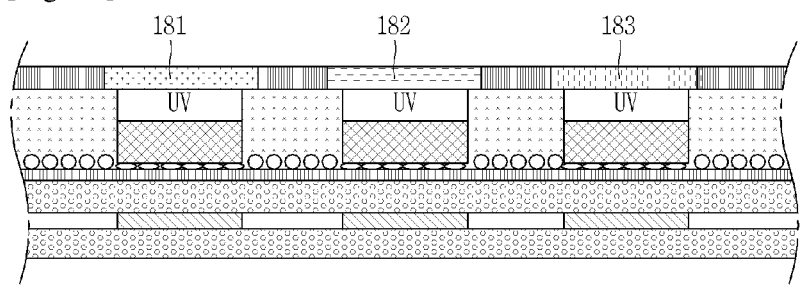

[Fig. 6]
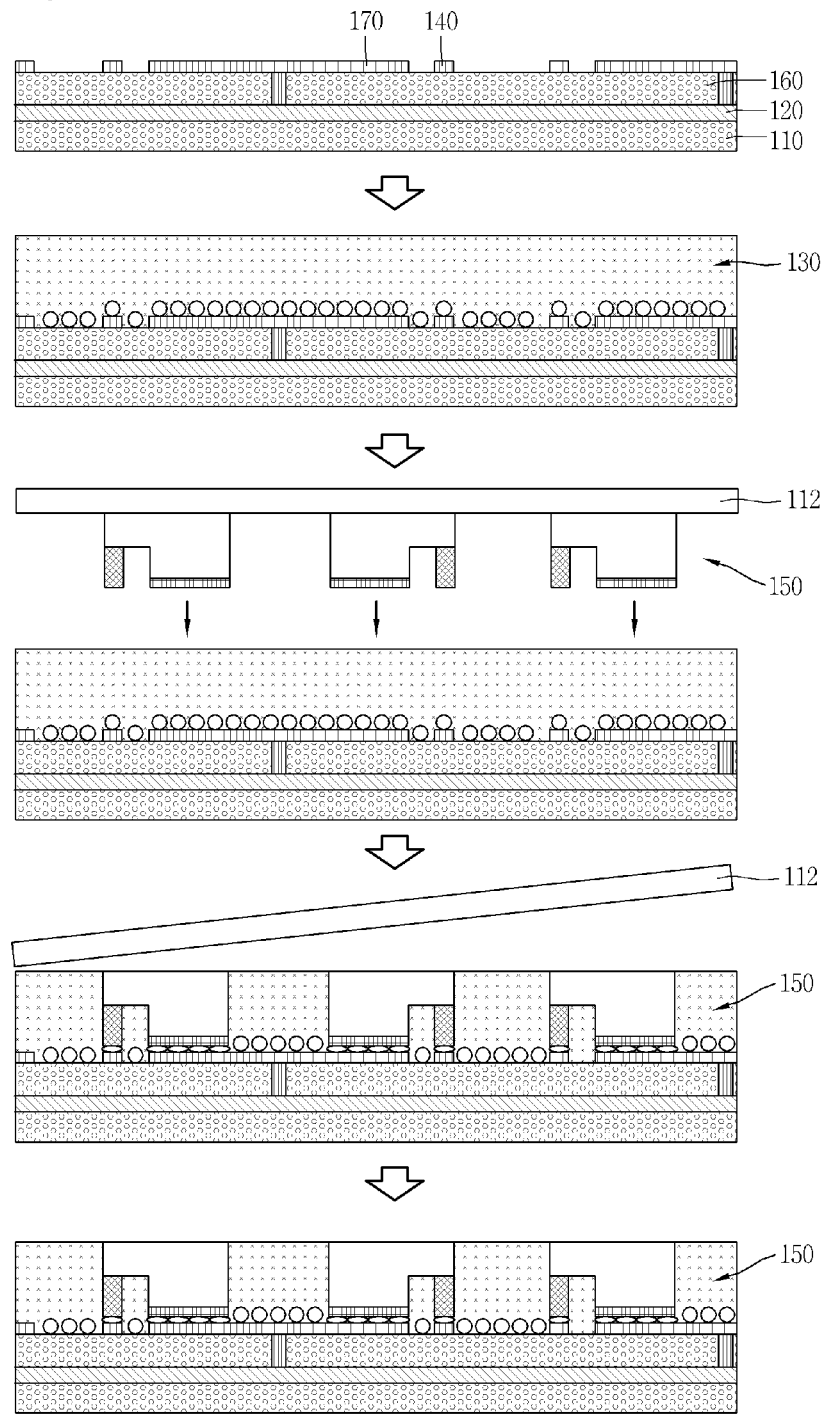

[Fig. 7]
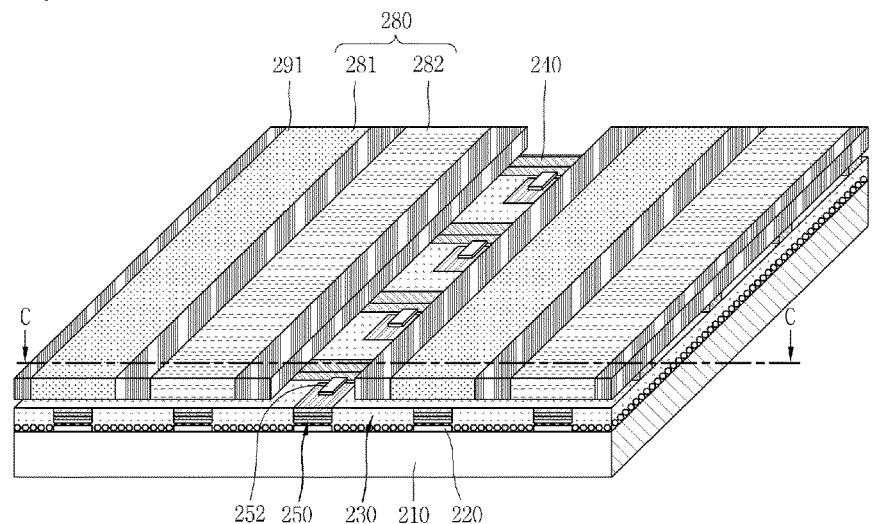
[Fig. 8]
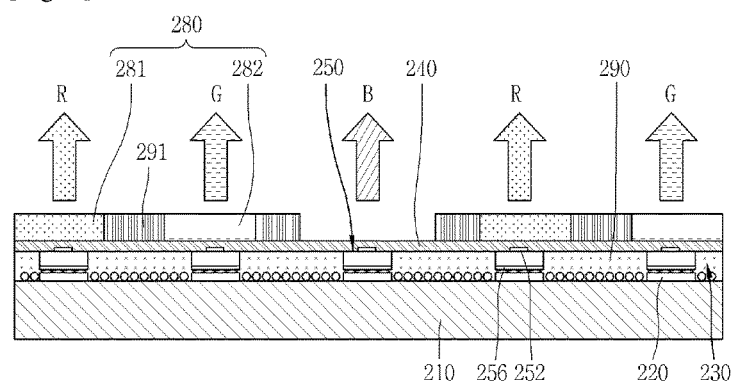
[Fig. 9]
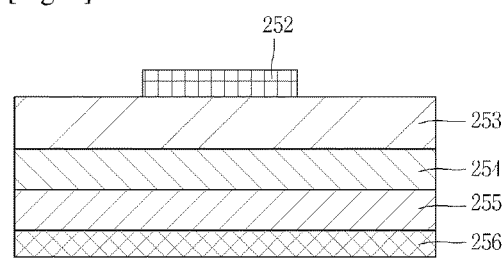
[Fig. 10]
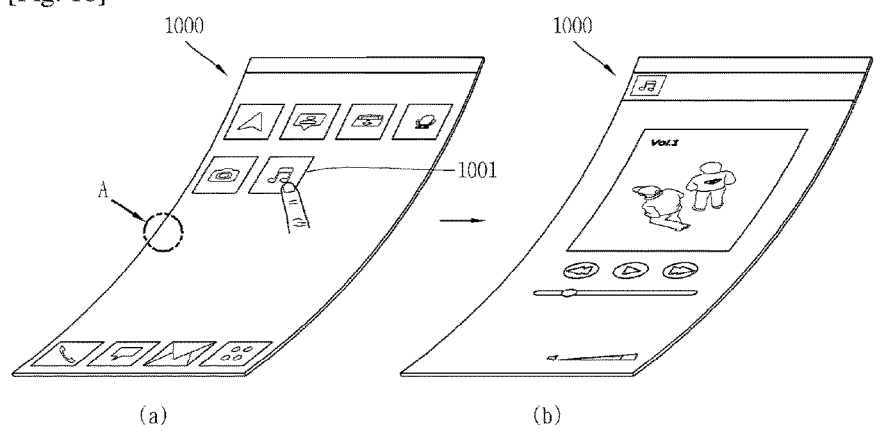
(a)          (b)

[Fig. 11]
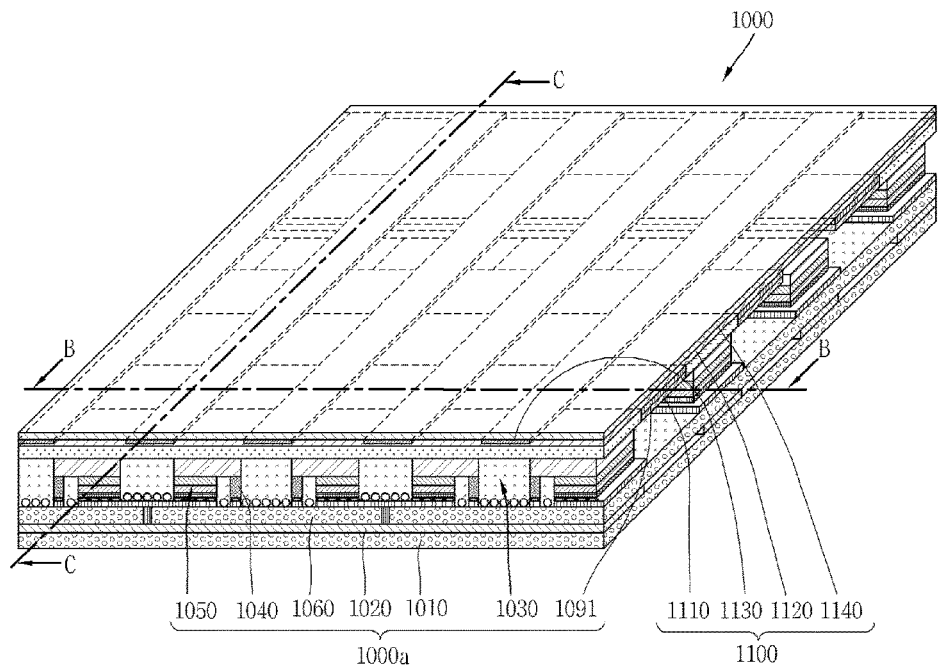
[Fig. 12a]
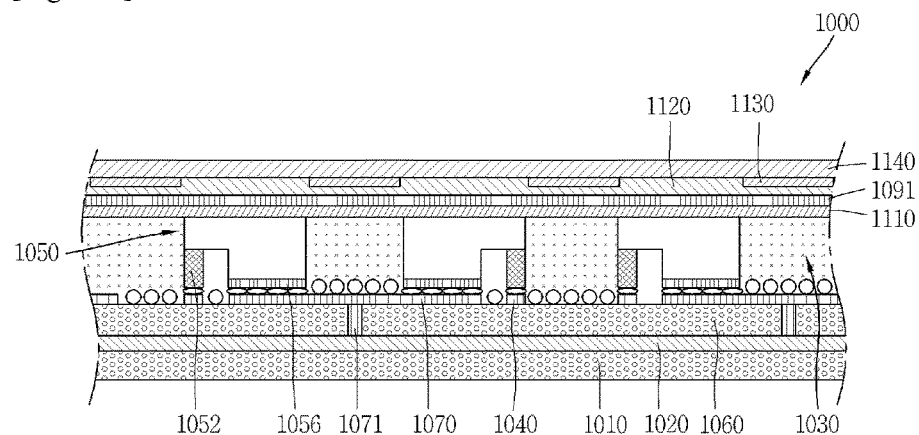
[Fig. 12b]
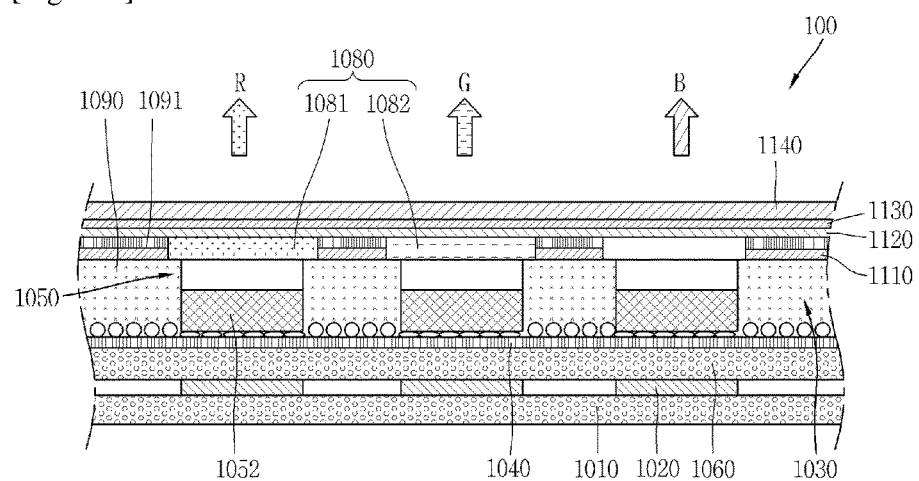

[Fig. 13a]
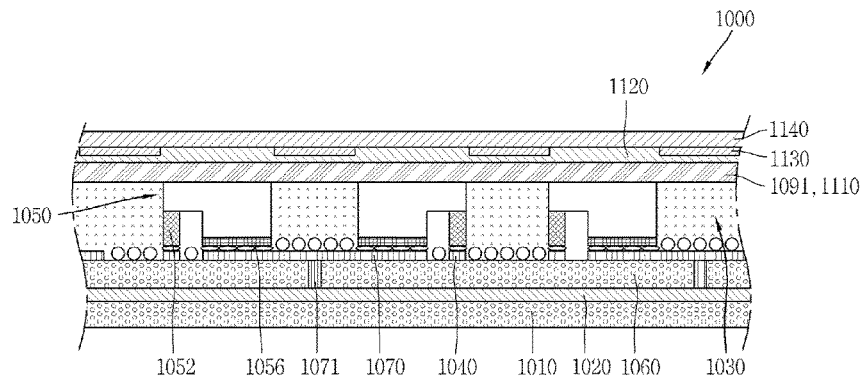
[Fig. 13b]
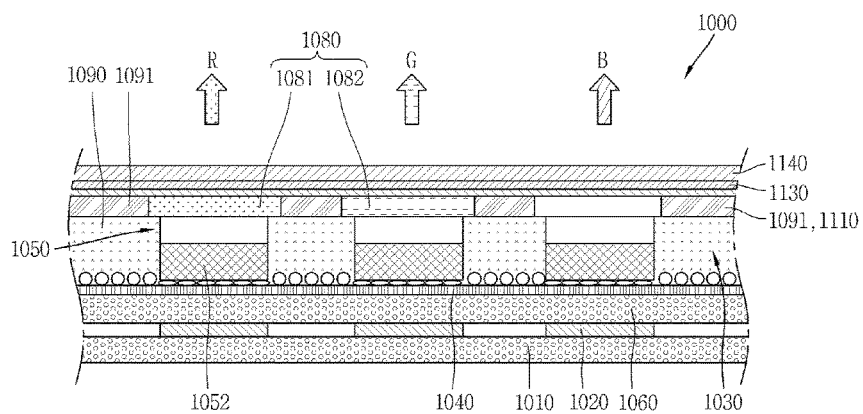
[Fig. 14a]
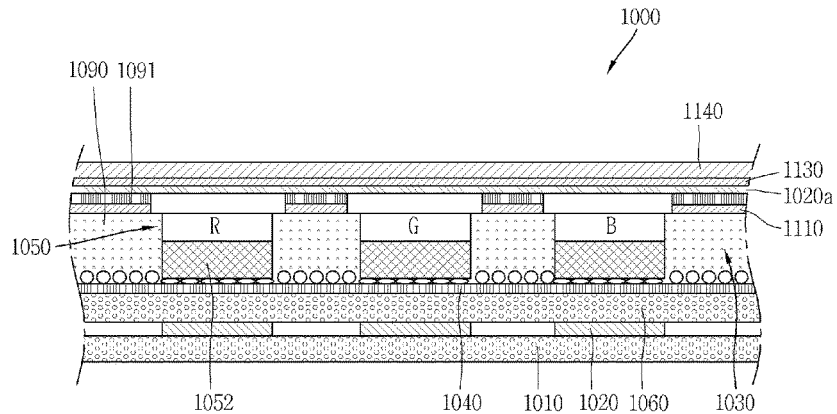
[Fig. 14b]
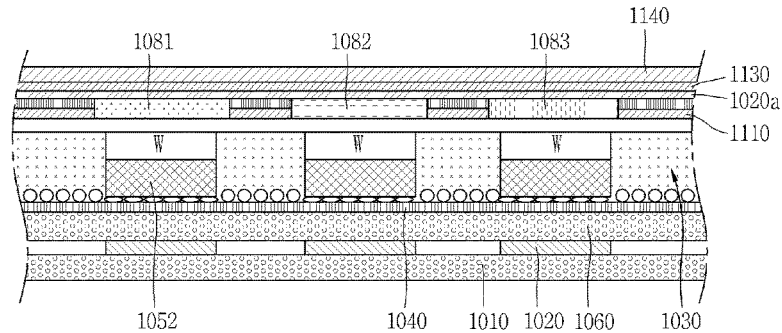

[Fig. 14c]
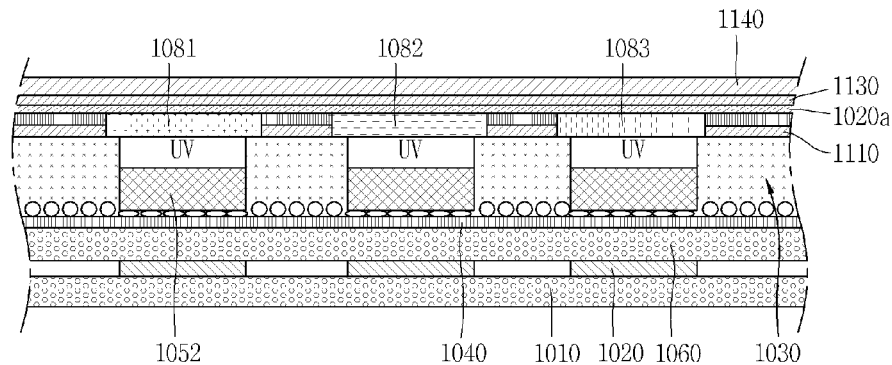
[Fig. 15a]
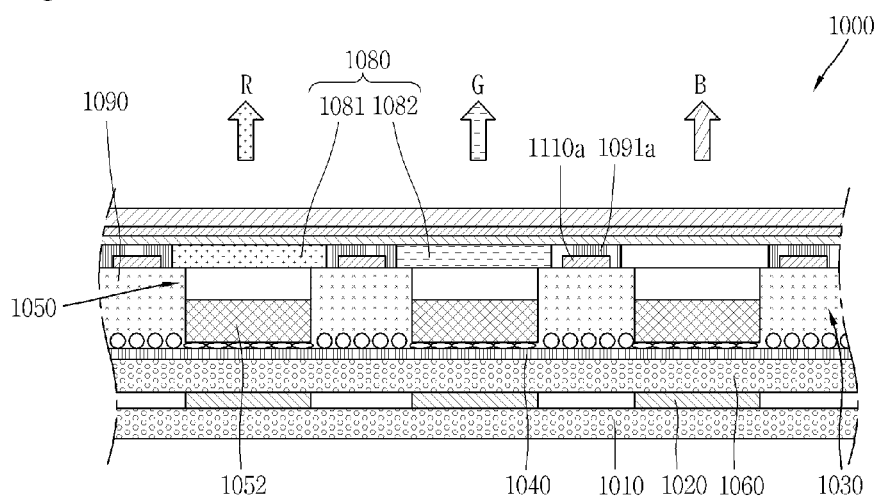
[Fig. 15b]
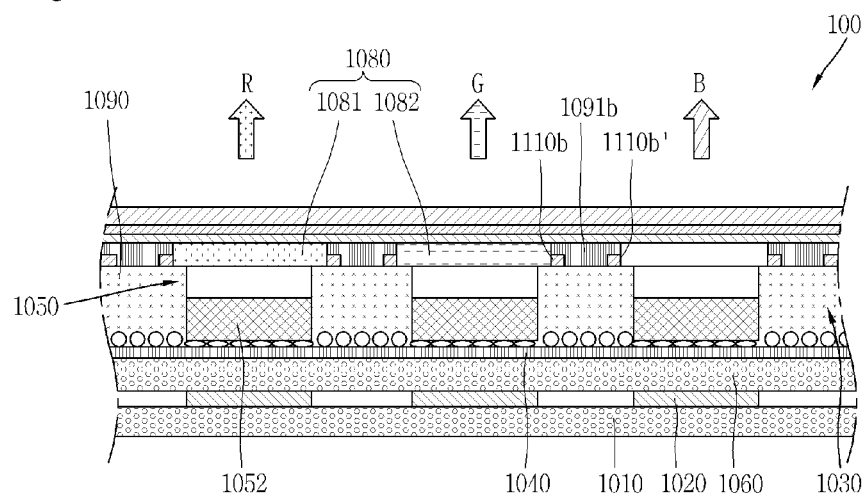

[Fig. 15c]
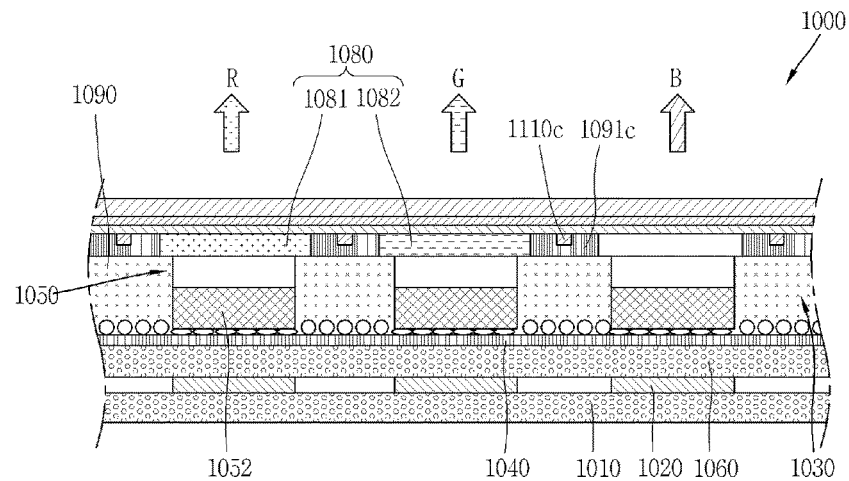
[Fig. 15d]
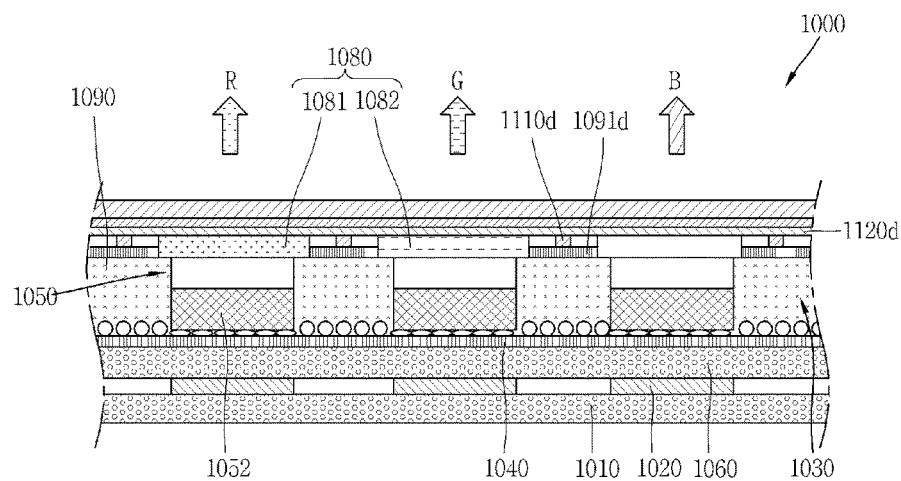
[Fig. 16]
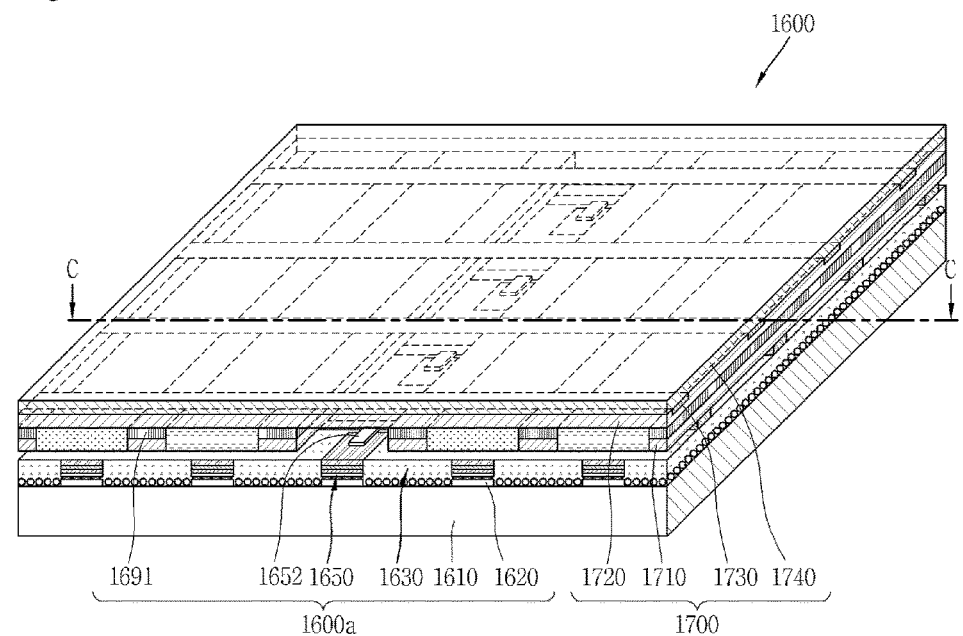

[Fig. 17]
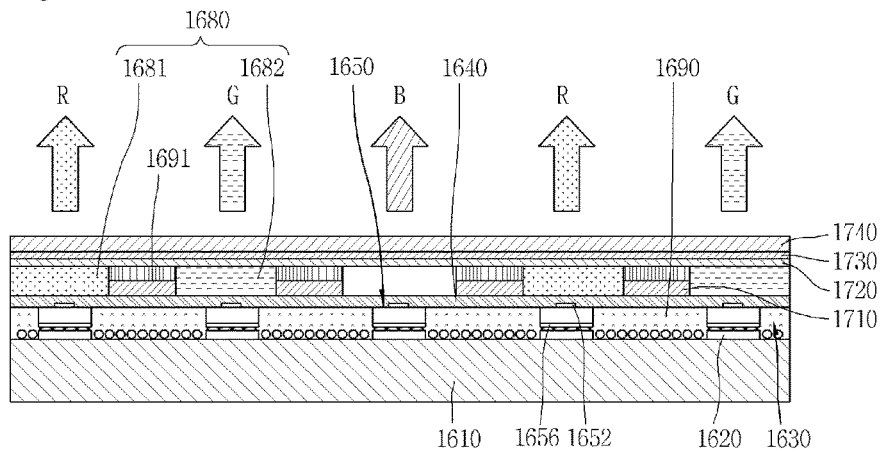
[Fig. 18]
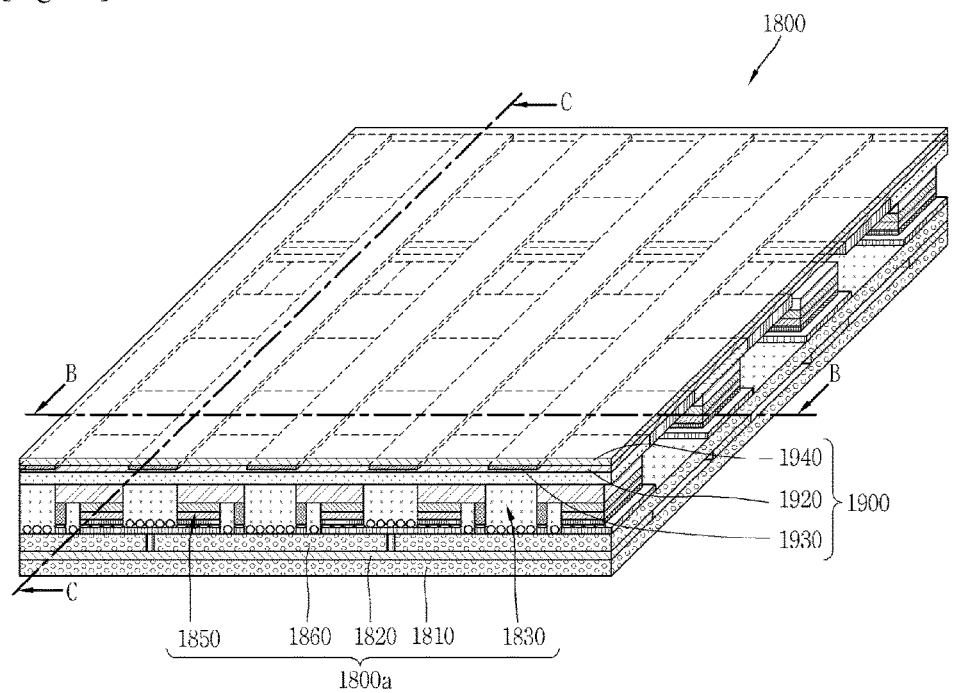
[Fig. 19a]
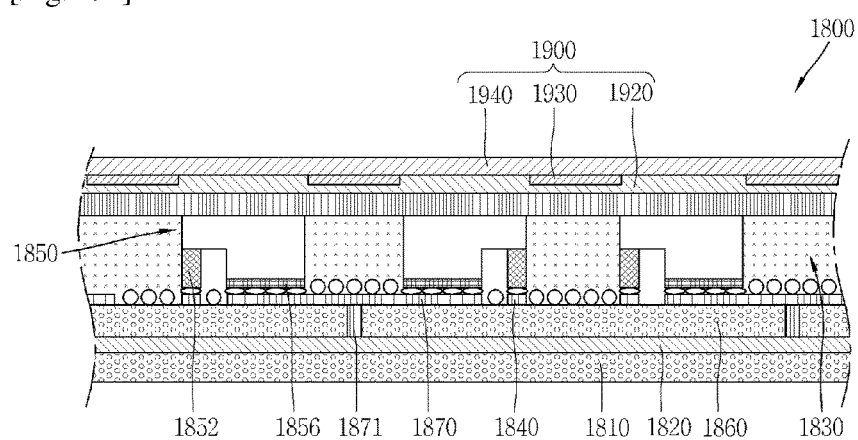

[Fig. 19b]
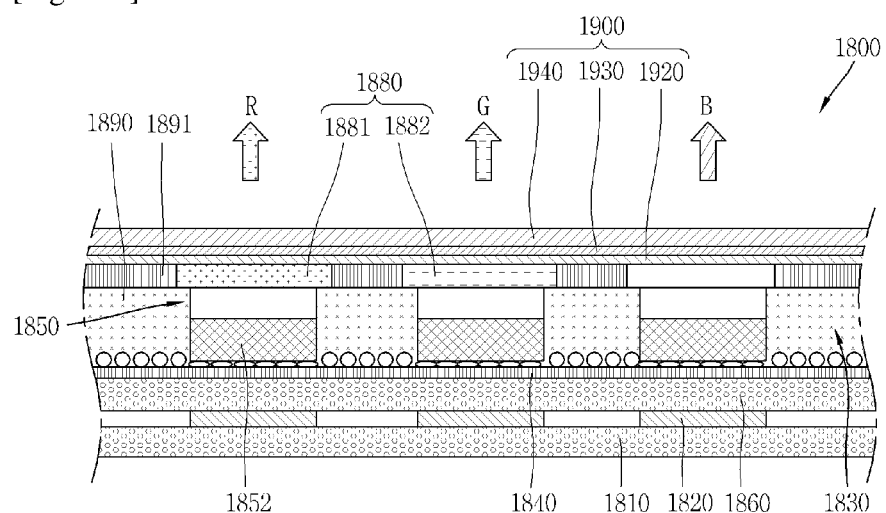
[Fig. 20]
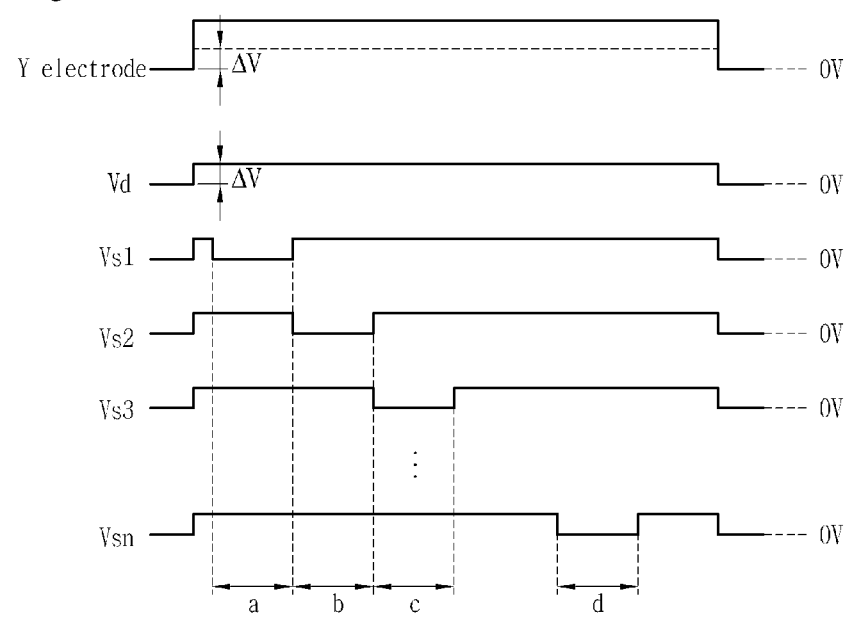

[Fig. 21]
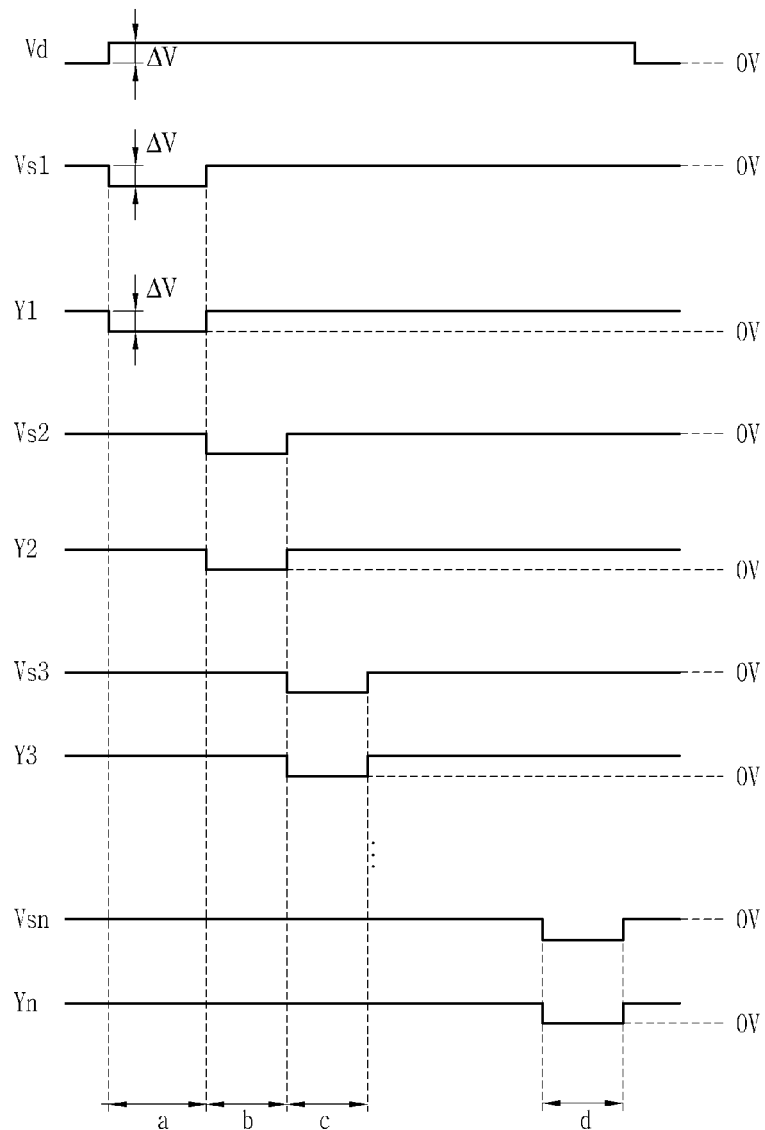
[Fig. 22a]
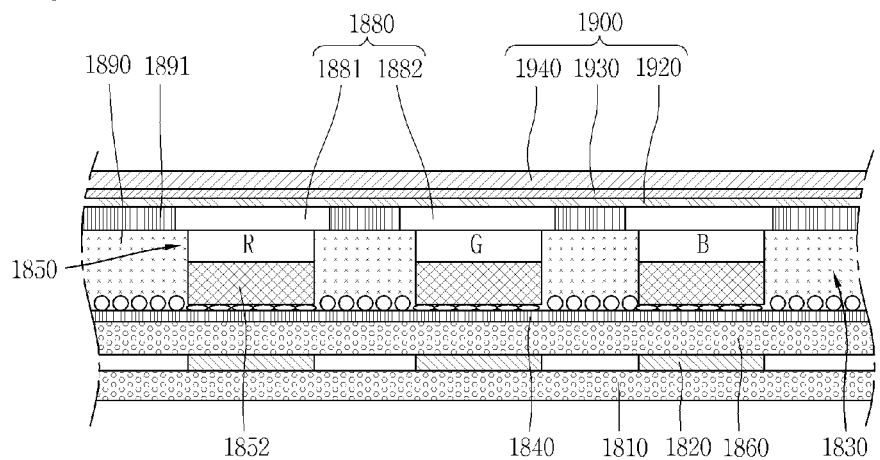

[Fig. 22b]
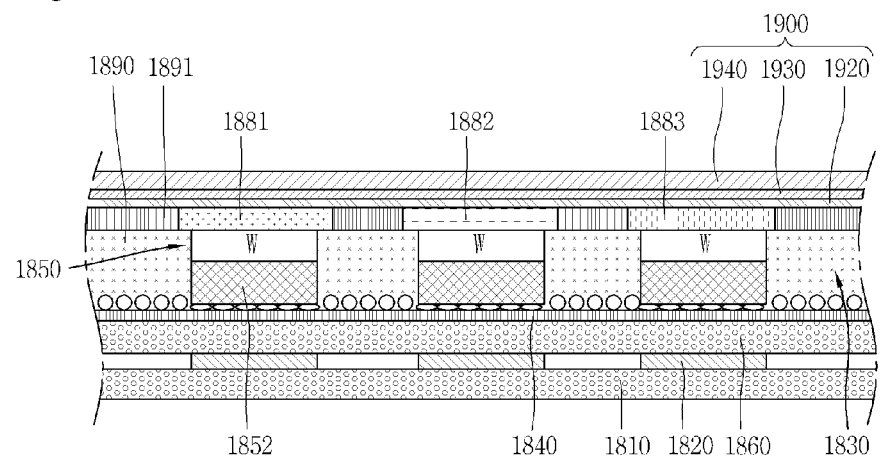
[Fig. 22c]
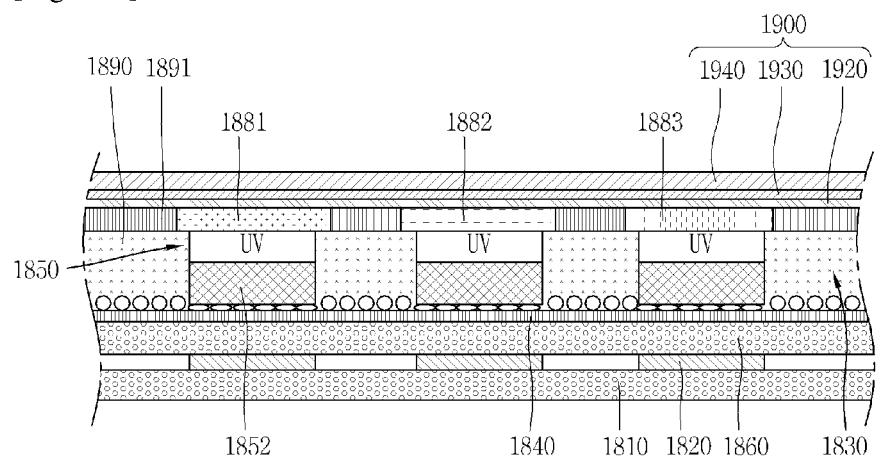
[Fig. 23]
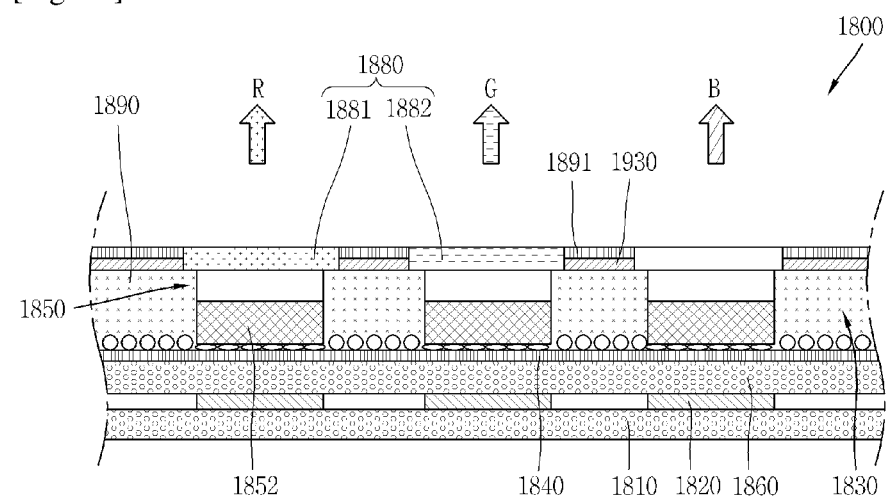

[Fig. 24]
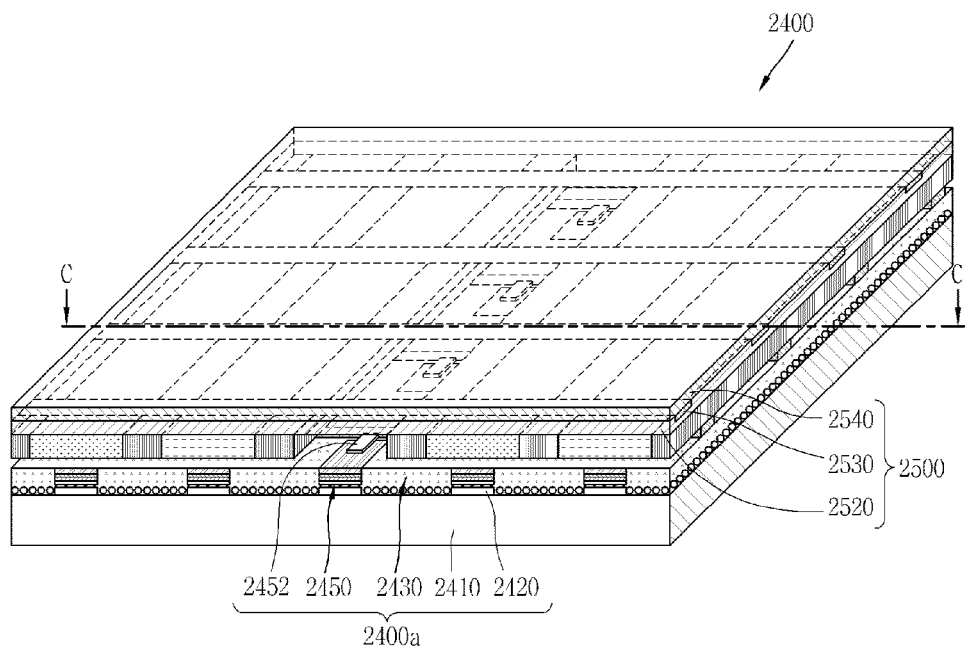
[Fig. 25]
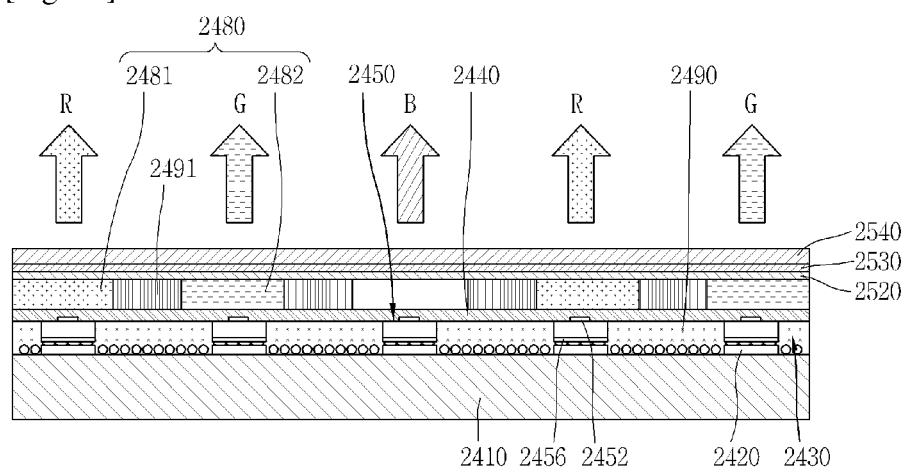
[Fig. 26]
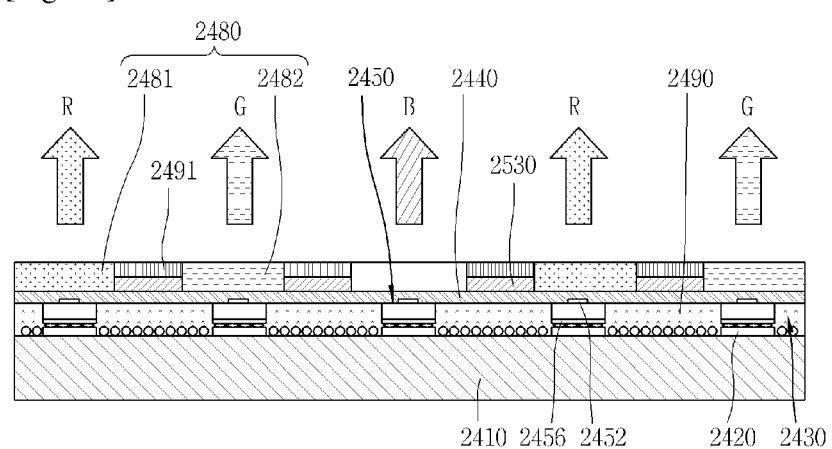

DISPLAY APPARATUS USING SEMICONDUCTOR LIGHT EMITTING DEVICE

CROSS-REFERENCE TO RELATED APPLICATIONS

This application is the National Stage filing under 35 U.S.C. 371 of International Application No. PCT/KR2014/010312, filed on Oct. 30, 2014, which claims the benefit of earlier filing date and right of priority to Korean Application No. 10-2013-0140036, filed on Nov. 18, 2013, the contents of which are all incorporated by reference herein in their entirety.

TECHNICAL FIELD

The present disclosure relates to a display apparatus, and particularly, to a display apparatus using a semiconductor light emitting device.

BACKGROUND ART

Recently, display apparatuses having excellent characteristics such as thin film characteristics, flexibility, and the like, have been developed in display technical fields. Currently commercialized major displays are represented by liquid crystal displays (LCDs) and active matrix organic light emitting diodes (OLEDs).

LCDs have a problem in that a response time is not fast and flexibility is difficult to implement, and AMOLEDs involve weak points in that a lifespan is short, a production yield is not good, and flexibility is weak.

Meanwhile, light emitting diodes (LEDs) are semiconductor light emitting devices well known to convert a current into light. Since red LEDs using a GaAsP compound semiconductor was commercialized in 1962, red LEDs have been used as light sources for displaying images of electronic devices including information communication devices, together with GaP:N-based green LEDs. Thus, a scheme of solving the above problem by implementing a flexible display using the semiconductor light emitting device may be proposed.

Also, such a display apparatus may have a touch sensor, and a structure of a touch sensor capable of reducing a thickness of a display apparatus may be considered.

DISCLOSURE OF INVENTION

Technical Problem

Therefore, an aspect of the detailed description is to provide a new, flexible display apparatus different from a related art.

Another aspect of the detailed description is to provide a structure of a touch sensor enabling reduction of a thickness of a display apparatus.

Solution to Problem

To achieve these and other advantages and in accordance with the purpose of this specification, as embodied and broadly described herein, a display apparatus including a touch sensor unit and a display unit controlled based on a touch input sensed through the touch sensor unit, wherein the display unit includes: a conductive bonding layer; and a plurality of semiconductor light emitting devices combined with the conductive bonding layer and arranged to form a plurality of rows, and the touch sensor unit includes: an X electrode disposed between the plurality of rows of the plurality of semiconductor light emitting devices in the display unit; and an Y electrode configured to be combined with the X electrode to sense a touch input.

In an exemplary embodiment of the present disclosure, the display apparatus may further include: a black matrix disposed to cover the X electrode between the plurality of semiconductor light emitting devices.

In an exemplary embodiment of the present disclosure, phosphor layers may be formed on one surfaces of the plurality of semiconductor light emitting devices, and the black matrix and the X electrode may be positioned between the phosphor layers, respectively.

In an exemplary embodiment of the present disclosure, the X electrode may be disposed between the conductive bonding layer and the black matrix.

In an exemplary embodiment of the present disclosure, the X electrode and the black matrix may be formed of materials having different resistance values, respectively.

In an exemplary embodiment of the present disclosure, the X electrode may be formed as being black to alleviate reflection between the phosphor layers provided in the display unit.

In an exemplary embodiment of the present disclosure, the X electrode may be formed as a single layer between the phosphor layers.

In an exemplary embodiment of the present disclosure, the X electrode may be disposed inside the display unit, the Y electrode may be formed in an electrode film formed of a light-transmissive material allowing light emitted from the plurality of semiconductor light emitting devices to be transmitted therethrough, and the electrode film may be disposed to overlap the plurality of semiconductor light emitting devices outside the display unit.

In an exemplary embodiment of the present disclosure, a light-transmissive member may be disposed between the electrode film and the plurality of semiconductor light emitting devices to space the X and Y electrodes and allow light from the semiconductor light emitting devices to be transmitted therethrough.

In an exemplary embodiment of the present disclosure, the display unit may include: a plurality of horizontal electrode lines electrically connected to the plurality of semiconductor light emitting devices; and a plurality of vertical electrode lines arranged in a direction crossing the plurality of horizontal electrode lines and disposed to be parallel to the X electrode.

In an exemplary embodiment of the present disclosure, the plurality of horizontal electrode lines and the plurality of vertical electrode lines may be formed on a wiring board covered by the conductive bonding layer.

In an exemplary embodiment of the present disclosure, the display unit may include a vertical electrode and a horizontal electrode electrically connected to the plurality of semiconductor light emitting devices and arranged in mutually crossing directions, and any one of the vertical electrode and the horizontal electrode may have a potential difference from the X electrode such that the any one of the vertical electrode and the horizontal electrode becomes a Y electrode of the touch sensor unit.

In an exemplary embodiment of the present disclosure, the touch sensor unit may sense a touch input through a signal transmission line formed between any one of the vertical electrode and the horizontal electrode and the X electrode.

To achieve these and other advantages and in accordance with the purpose of this specification, as embodied and broadly described herein, a display apparatus including: first and second electrodes; a conductive bonding layer electrically connected to at least one of the first and second electrodes; a semiconductor light emitting device combined with the conductive bonding layer; a third electrode configured to form a potential difference with any one of the first and second electrodes to sense a touch input; and a controller configured to control the semiconductor light emitting device through a first signal transmission line formed by the first and second electrodes and process a touch input sensed through a second signal transmission line formed by any one of the first and second electrodes and the third electrode.

In an exemplary embodiment of the present disclosure, a driving signal of the semiconductor light emitting device may be generated due to a first potential difference formed between the first and second electrodes, and a second potential difference formed between the any one of the first and second electrodes and the third electrode to sense a touch input may be greater than the first potential difference.

In an exemplary embodiment of the present disclosure, an influence of the generated first potential difference on the second potential difference may be processed as noise in sensing the touch input.

In an exemplary embodiment of the present disclosure, magnitudes of voltages applied to any one of the first and second electrode and the other may be smaller than a magnitude of a voltage applied to the third electrode.

In an exemplary embodiment of the present disclosure, the semiconductor light emitting device may be turned on based on a potential difference between the first and second electrodes formed as a potential of any one of the first and second electrodes is changed, and a potential of the third electrode may be changed in response to the change in the potential of any one of the first and second electrodes to maintain the potential difference for sensing a touch input.

In an exemplary embodiment of the present disclosure, the change in the potential of any one of the first and second electrodes and the change in the potential of the third electrode may be generated in the form of a pulse, respectively, and the potentials may be changed at the same point in time and with the same magnitude.

In an exemplary embodiment of the present disclosure, the third electrode may be formed on an electrode film formed of a light-transmissive material allowing light emitted from the semiconductor light emitting device to be transmitted therethrough, and the electrode film may be disposed to overlap the semiconductor light emitting device.

In an exemplary embodiment of the present disclosure, the third electrode may be disposed between a plurality of semiconductor light emitting devices arranged to form a plurality of rows and combined with any one of the first and second electrodes to sense a touch input.

According to exemplary embodiments of the present disclosure, by disposing at least one of a plurality of electrodes constituting a touch sensor in a display unit, a space occupied by the electrode may be reduced. Thus, a thinner display apparatus can be provided.

Further scope of applicability of the present application will become more apparent from the detailed description given hereinafter. However, it should be understood that the detailed description and specific examples, while indicating preferred exemplary embodiments of the invention, are given by way of illustration only, since various changes and modifications within the spirit and scope of the invention will become apparent to those skilled in the art from the detailed description.

Advantageous Effects of Invention

As described above, according to the present disclosure, by utilizing any one of the first and second electrodes of the display unit, as an electrode of the touch sensor, a thickness of the touch sensor can be reduced.

BRIEF DESCRIPTION OF DRAWINGS

FIG. 1 is a conceptual view illustrating a display apparatus using a semiconductor light emitting device according to an exemplary embodiment of the present disclosure;

FIG. 2 is a partially enlarged view of portion 'A' of FIG. 1;

FIGS. 3A and 3B are cross-sectional views taken along line B-B, and C-C of FIG. 2;

FIG. 4 is a conceptual view illustrating a flipchip type semiconductor light emitting device of FIG. 3A;

FIGS. 5A through 5C are conceptual views illustrating various configurations implementing color in relation to the flipchip type semiconductor light emitting device;

FIG. 6 includes cross-sectional views illustrating a method of manufacturing a display apparatus using a semiconductor light emitting device according to an exemplary embodiment of the present disclosure;

FIG. 7 is a perspective view illustrating a display apparatus using a semiconductor light emitting device according to another exemplary embodiment of the present disclosure;

FIG. 8 is a cross-sectional view taken along line C-C of FIG. 7;

FIG. 9 is a conceptual view illustrating a vertical semiconductor light emitting device of FIG. 8;

FIG. 10 is a conceptual view illustrating an example of a display apparatus including a touch sensor;

FIG. 11 is an enlarged view of portion 'A' of FIG. 10;

FIGS. 12A and 12B are cross-sectional views taken along lines B-B and C-C of FIG. 11;

FIGS. 13A and 13B are cross-sectional views illustrating another example in relation to a touch sensor;

FIGS. 14A, 14B, and 14C are conceptual views illustrating various configurations implementing color in relation to a flipchip type semiconductor light emitting device to which the present invention is applied and various types of stacked structures for implementing touch sensors;

FIGS. 15A, 15B, 15C, and 15D are conceptual views illustrating various configurations in which electrodes of a touch sensor are disposed in a black matrix;

FIG. 16 is a perspective view illustrating a display apparatus using a semiconductor light emitting device according to another exemplary embodiment of the present disclosure;

FIG. 17 is a cross-sectional view taken along line C-C of FIG. 16;

FIG. 18 is a perspective view illustrating a display apparatus using a semiconductor light emitting device according to another exemplary embodiment of the present disclosure;

FIGS. 19A and 19B are cross-sectional views taken along line B-B and C-C of FIG. 18;

FIGS. 20 and 21 are conceptual views of signal processing illustrating driving of a semiconductor light emitting device and a touch sensor in the display apparatus of FIG. 18;

FIGS. 22A, 22B, and 22C are conceptual views illustrating various configurations implementing color in relation to a flipchip type semiconductor light emitting device to which the present invention is applied and various types of stacked structures for implementing touch sensors;

FIG. 23 is a cross-sectional view illustrating a structure in which electrodes of the touch sensor is further disposed in the display apparatus of FIG. 18;

FIG. 24 is a perspective view illustrating a display apparatus using a semiconductor light emitting device according to another exemplary embodiment of the present disclosure;

FIG. 25 is a cross-sectional view taken along line C-C of FIG. 16; and

FIG. 26 is a cross-sectional view illustrating a structure in which electrodes of the touch sensor is disposed on a display unit of the display apparatus of FIG. 24.

MODE FOR THE INVENTION

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices are grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiment of the invention may not be necessarily limited to this, and another structure for implementing blue, red and green may be also applicable thereto.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

FIG. 7 is a perspective view illustrating a display device using a semiconductor light emitting device according to another embodiment of the invention. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In case of a rectangular shaped element, the size thereof may be less than 20×80 µm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiment of the invention may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

The display apparatus described above may further include a touch sensor for sensing a touch operation applied to the display apparatus.

The display apparatus having the touch sensor may include a display unit (or a display module) and the touch sensor and may be used as an input device as well as an output device.

The touch sensor can sense a touch applied to the display apparatus using any of a variety of touch methods. Examples of such touch methods include a resistive type, a capacitive type, an infrared type, a ultrasonic type, and a magnetic field type, among others. Hereinafter, a structure of the display apparatus having a touch sensor that senses a touch in a capacitive manner will be described in detail. However, the structure of the touch sensor according to an exemplary embodiment of the present invention is not limited only to the capacitive scheme. For example, a magnetic field type including a magnetic field coil may be applied to the touch sensor. In this case, any one of an X electrode and a Y electrode based on a capacitive scheme may be a magnetic coil and the other may be omitted.

The touch sensor that senses a touch in the capacitive manner may be configured to convert a pressure applied to a particular portion of a display module or a change in capacitance generated in a particular portion of the display module, into an electrical input signal. When a touch input is applied to the touch sensor, corresponding signal(S) may be processed by a controller of the display apparatus, and the processed signal may be converted into corresponding data. Hereinafter, a display apparatus based on a capacitive scheme will be described in detail with reference to the accompanying drawings. FIG. 10 is a conceptual view illustrating an example of a display apparatus including a touch sensor.

As illustrated in FIG. 10, information processed by a controller of a display apparatus 1000 may be displayed using a flexible display. Descriptions of FIG. 1 will be used as descriptions of the flexible display.

As illustrated, the display apparatus 1000 configured as a flexible display may have a touch sensor. For example, as illustrated in (a) of FIG. 10, when a touch input is applied to the display apparatus 1000, the controller (not shown) may process the touch input and perform controlling corresponding to the processed touch input. For example, when a touch input is applied to a certain icon 1001 in (a) of FIG. 10, corresponding screen information may be output to the display apparatus 1000. In this case, the touch input may be applied to the flexible display in a bent state, and the touch sensor is configured to sense the touch input applied in the state.

In the display apparatus 1000 configured as a flexible display, a unit pixel may be formed by a semiconductor light emitting device. In an exemplary embodiment of the present disclosure, a light emitting diode (LED) is illustrated as a type of a semiconductor light emitting device that converts a current into light. The LED has a small size, and thus, the LED may serve as a unit pixel even in the second state.

Hereinafter, a flexible display implemented using an LED and having a touch sensor will be described in detail with reference to the accompanying drawings. FIG. 11 is an enlarged view of portion 'A' of FIG. 10, and FIGS. 12A and 12B are cross-sectional views taken along lines B-B and C-C of FIG. 11.

As illustrated in FIGS. 11, 12A, and 12B, the display apparatus 1000 using a passive matrix (PM) type semiconductor light emitting device is illustrated as a display apparatus 1000 using a semiconductor light emitting device. However, the present disclosure described hereinafter may also be applied to an active matrix (AM) type semiconductor light emitting device.

The display apparatus 1000 may include a display unit 1000a forming screen information by emitting R, G, and B light and a touch sensor 1100 sensing a touch input applied to the display apparatus 1000. Hereinafter, in the exemplary embodiment or the modified example described hereinafter, the like or similar reference numerals are given to components identical or similar to those of the former example, and redundant description thereof will be omitted.

The display unit 1000a includes a board 1010, a first electrode 1020, a conductive bonding layer 1030, a second electrode 1040, and a plurality of semiconductor light emitting devices 1050. Here, the first electrode 1020 and the second electrode 1040 may include a plurality of electrode lines, respectively.

The board 1010 may be a wiring board on which a plurality electrode lines included in the first electrode 1020 are disposed, and thus, the first electrode 1020 may be positioned on the board 1010. Also, the second electrode 1040 is disposed on the board 1010. For example, the board 1010 may be a wiring board including a plurality of layers, and the first electrode 1020 and the second electrode 1040 may be formed on each of the plurality of layers. In this case, the wiring board may be a board in which the board 110 and the insulating layer 160 of the display apparatus described above with reference to FIGS. 3A and 3B are integrally formed of a material having insulating properties and flexibility such as polyimide (PI), PET, PEN, or the like.

As illustrated, the first electrode 1020 and the second electrode 1030 are electrically connected to a plurality of semiconductor light emitting devices 1050. In this case, the first electrode 1020 may be connected to the plurality of semiconductor light emitting devices 1050 by the medium of an auxiliary electrode 1070 disposed to be coplanar with the second electrode 1030. The first electrode 1020 and the second electrode 1040 may be electrically connected to the plurality of semiconductor light emitting devices 1050 by a conductive bonding layer 1030 disposed on one surface of the board 1010.

The conductive bonding layer 1030 may be a layer having adhesion and conductivity, and to this end, the conductive bonding layer 1030 may be formed of a mixture of a material having conductivity and a material having adhesion. Also, the conductive bonding layer 1030 may have ductility to enable the display apparatus to have a flexible function.

For example, the conductive bonding layer 1030 may be an anisotropy conductive film (ACF), anisotropy conductive paste, or a solution containing conductive particles, for example. In a state in which the auxiliary electrode 1070 and the second electrode 1040 are positioned, the conductive bonding layer 1030 is formed, and thereafter, when the semiconductor light emitting devices 1050 are connected in a flipchip manner by applying heat and pressure thereto, the semiconductor light emitting devices 1050 are electrically connected to the first electrode 1020 and the second electrode 1040.

In this manner, the plurality of semiconductor light emitting devices 1050 are coupled to the conductive bonding layer 1030, forming a plurality of rows along at least one of the plurality of electrode lines.

As illustrated, the plurality of semiconductor light emitting devices 1050 may form a plurality of rows in a direction parallel to the plurality of electrode lines provided in the first electrode 1020. However, the present disclosure is not limited thereto, and for example, the plurality of semiconductor light emitting devices 1050 may form a plurality of rows along the second electrode 1040.

In addition, the display unit 1000*a* may further include a phosphor layer 1080 formed on one surface of the plurality of semiconductor light emitting devices 1050. For example, the semiconductor light emitting device 1050 may be a blue semiconductor light emitting device emitting blue (B) light, and the phosphor layer 1080 serves to convert the blue (B) light into a color of a unit pixel. The phosphor layer 1080 may be a red phosphor 1081 or a green phosphor 1082 constituting an individual pixel. Namely, in a position forming a red unit pixel, the red phosphor 1081 capable of converting blue light into red (R) light may be stacked on the blue semiconductor light emitting device 1050, and in a position forming a green unit pixel, the green phosphor 1082 capable of converting blue light into green (G) light may be stacked on the blue semiconductor light emitting device 1050. Also, in a portion forming a blue unit pixel, only the blue semiconductor light emitting device 1050 may be used alone. In this case, the red (R), green (G), and blue (B) unit pixels may constitute a single pixel, respectively. In detail, a phosphor of one color may be stacked along each line of the first electrode 1020. Thus, one line of the first electrode 1020 may be an electrode controlling one color. Namely, the red (R), green (G), and blue (B) phosphors may be disposed in sequence along the second electrode 1040, thus forming unit pixels. However, the present disclosure is not limited thereto and the semiconductor light emitting devices 1050 and quantum dots (QD), instead of phosphors, may be combined with form unit pixels emitting red (R), green (G), and blue (B).

Meanwhile, in order to increase contrast of the phosphor layer 1080, the display unit 1000*a* may further include a black matrix 1091 disposed between phosphors. The black matrix 1091 may be formed by forming a gap between phosphor dots and filling the gap with a black material. Accordingly, the black matrix 1901 may absorb reflection of external light and increase the contrast. The black matrix 1091 is positioned between the phosphor layers 1080 along the first electrode 1020 in a direction in which the phosphor layers 1080 are stacked. In this case, a phosphor layer is not formed in a position corresponding to the blue semiconductor light emitting device 1051, but the black matrix 1091 may be formed on both sides of the space without the phosphor layer (on both sides of the blue semiconductor light emitting device 1050).

The touch sensor 1100 operating cooperatively with the display unit 1000*a* including the configuration as described above includes an X electrode 1110, a Y electrode 1130 stacked on the display unit, and a spacer 1120 separating the X and Y electrodes 1110 and 1130. The X and Y electrodes 1110 and 1130 are arranged in directions in which they cross each other, and receive electric charges from a power supply unit (not shown). Thus, in a state in which a potential difference is formed between the X and Y electrodes 1110 and 1130, when the display apparatus 1000 is touched with a conductor, for example, a user's finger, or the like, quantities of electric charge charged in the X and Y electrodes 1110 and 1130 are changed, respectively. Based on the change in the quantities of electric charges, the controller (not shown) may calculate positions of an X axis and a Y axis, and a touched input point may be specified by the calculation value. Meanwhile, in the present disclosure, the X electrode and the Y electrode are relative concepts, rather than having a general meaning of the terms. Thus, the X electrode is not necessarily identical to an X-axis direction and the Y electrode is not necessarily identical to an Y-axis direction. Namely, When any one of the X electrode and the Y electrode is in the X-axis direction, the other may be in the Y-axis direction.

Positions of the X electrode 1110 and the Y electrode 1130 of the touch sensor 1100 in the display apparatus 1000 will be described in detail. As illustrated, the X electrode 1110 of the touch sensor 1100 is disposed between the semiconductor light emitting devices 1050 forming a plurality of rows in the display unit 1100*a*. In detail, as illustrated in FIG. 12B, the X electrode 1110 may be disposed between the plurality of rows on the conductive bonding layer 1030. Since spaces between the plurality of rows form a plurality of parallel lines, the X electrode 1110 may be inserted into the stacked structure of the display unit 1110*a*, and thus, a touch screen having a good touch sense and having a reduced thickness may be formed.

In a specific example, the X electrode 1110 includes a plurality of electrode lines, and the plurality of electrode lines of the X electrode 1110 are disposed to be separated in a horizontal direction between the semiconductor light emitting devices 1050 forming the plurality of rows. Thus, the X electrode 1110 may be positioned in the position of the black matrix 1091 (between the phosphor layers or between the semiconductor light emitting devices). In a case in which the X electrode 1110 is disposed in the position of the black matrix 1091, the X electrode 1110 may be formed to be covered by the black matrix 1091 or may cover the black matrix 1091.

In this manner, since the electrodes 1110 and the black matrix 1091 overlap, the black matrix 1091 and the X electrode 1110 may be positioned together between the phosphor layers.

In addition, the X electrode 1110 of the touch sensor 1100 may be positioned inside the display unit 1000*a*, while the Y electrode 1130 of the touch sensor 1100 may be positioned outside the display unit 1000*a*. As illustrated, the Y electrode 1130 is disposed to overlap the plurality of semiconductor light emitting devices 1050 outside the display unit 1000*a*, and combined with the X electrode 1110 to sense a touch input. The Y electrode 1130 may be formed on an electrode film 1140 formed of a light-transmissive material allowing light emitted from the plurality of semiconductor light emitting devices 1050 to be transmitted therethrough. As illustrated, the Y electrode 1130 may protrude from one surface of the electrode film 1140 and may be formed inside the electrode film 1140. In a case in which the Y electrode 1130 is formed inside the electrode film 1140, the electrode film 1140 may be formed as a plurality of layers.

The spacer 1120 of the touch sensor 1100 serves to separate the X electrode 1110 and the Y electrode 1130 in a thickness direction of the display apparatus. However, the function of the spacer 1120 is not limited thereto. For example, the spacer 1120 may be understood to serve to fill a space between the X electrode 1110 and the Y electrode 1130.

The spacer 1120 may be formed as a light-transmissive member to allow light emitted from the plurality of semiconductor light emitting devices 1050 to be transmitted therethrough. The spacer 1120 is disposed between the electrode film 1140 and the plurality of semiconductor light emitting devices 1050. The spacer 1120 may be, for example, an optically clear adhesive (OCA) (or an optically clear adhesive film), a non-reflection film (or a low reflection film), or the like.

In a case in which the spacer 1120 is an optically clear adhesive, the electrode film 1140 and the black matrix may be coupled by the spacer 1120.

In another example, in a case in which the spacer 1120 is a non-reflection film, light is not reflected in the display apparatus, preventing a degradation of optical performance of the plurality of semiconductor light emitting devices 1050. In this case, the spacer 1120 may be a component of the display unit.

In another example, the spacer 1120 may include a plurality of layers formed by stacking optical clear adhesive and non-reflection films. In this case, the non-reflective films may be bonded by the optically clear adhesive. To sum up, the spacer 1120 may be defined as a member disposed in the spaces of the X electrode 1110 and the Y electrode 1130 to become a component of the touch sensor or a component of the display unit.

As described above, in the display apparatus 1000 according to an exemplary embodiment of the present disclosure, by positioning any one of the X electrode 1110 and the Y electrode 1120 forming the touch sensor 1100 in the display unit 1000a, a thickness of the touch sensor 1100 in a Z-axis direction can be reduced.

Meanwhile, the black matrix 1091 as described above may be formed of a material having a resistance value different from that of the X electrode 1110 and including a black material. Also, the black material 1091 may be formed of a material having conductivity. Thus, as illustrated in FIGS. 13A and 13B, the X electrode 1110 and the black matrix 1091 described above with reference to FIGS. 11, 12A and 12B may have a structure different from the structure in which they are stacked at corresponding positions.

For example, when the black matrix 1091 is formed of a material including a black material and having a resistance value appropriate for the X electrode 1110 of the touch sensor 1100 to be formed, the X electrode 1110 of the touch sensor 1100 and the black matrix 1091 may be formed as a single layer. In this case, the X electrode may be formed of a black material to alleviate reflection between the phosphors 1080 provided in the display unit 1000a. Namely, the X electrode 1110 may be formed as a single layer between the phosphor layers 1080.

In this manner, the X electrode 1110 of the touch sensor 1100 may serve as both an electrode and a black matrix 1091. Thus, in this case, the black matrix 1091 may be both a component of the display unit 1000a and a component of the touch sensor 1100.

So far, the case in which the display unit 1000a includes the blue semiconductor light emitting device that emits blue (B) light has been described, but the present disclosure is not limited thereto and any other structure for implementing blue, red, and green colors may be applied. FIGS. 14A, 14B, and 14C are conceptual views illustrating various configurations implementing color in relation to a flipchip type semiconductor light emitting device to which the present invention is applied and various types of stacked structures for implementing touch sensors.

Referring to FIG. 14A, each semiconductor light emitting device 1050 may be formed as a high output light emitting device, which formed of gallium nitride (GaN) as a main ingredient with indium (In) and/or aluminum (Al) added thereto, emitting light of various colors including blue light.

In this case, the semiconductor light emitting devices 150 may be red, green, and blue semiconductor light emitting devices forming unit pixels, respectively. For example, the red, green, and blue semiconductor light emitting devices R, G, and B may be alternately disposed, and red, green, and blue unit pixels constitute a single pixel by the red, green, and blue semiconductor light emitting devices, whereby a full color display may be implemented. The semiconductor light emitting devices may have an array structure forming a plurality of rows. In this case, the semiconductor light emitting devices that emit the same color may be disposed to correspond to the same row. For example, the semiconductor light emitting devices may be disposed in a plurality of rows along the plurality of first electrode lines 1020, and each of the lows may include semiconductor light emitting devices that emit light of the same color.

In the case in which the semiconductor light emitting devices implements R, G, and B, independently, a phosphor may not be provided. Meanwhile, even in this case, in order to enhance contrast and reflect external light, the display unit 1000a may further include the black matrix 1091 disposed between the plurality of rows of the semiconductor light emitting devices. As illustrated, the black matrix 1091 may be disposed to be spaced apart from each other in a horizontal direction. In addition, even in the structure, similar to the structure as described above, the X electrode 1110 of the touch sensor 1100 may be disposed in a position in which the black matrix 1091 is disposed. Namely, as illustrated, the X electrode 1110 of the touch sensor 1100 may be disposed between the semiconductor light emitting devices forming a plurality of rows, in particular, in a position corresponding to where the black matrix 1091 is disposed, in the display unit 1000a. The structure in which the X electrode is disposed in the position of the black matrix 1091 may employ the structure illustrated in FIGS. 12A and 12B, and a detailed description thereof will be replaced with the description of FIGS. 12A and 12B.

Meanwhile, although not shown, when the black matrix 1091 is formed of a material including a black material having conductivity and having a resistance value appropriate for the X electrode 11100 of the touch sensor 1100 to be formed, the X electrode 1110 of the touch sensor 1100 and the black matrix 1091 may be formed as a single layer.

The spacer 1120a may include a transparent resin to fill a space of the X electrode 1110 and the Y electrode 1130. For example, the transparent resin may be a PET film. In another example, the spacer 1120a may include a plurality of layers in which an optical clear adhesive and a transparent resin are stacked. In this case, the optical clear adhesive is stacked on the black matrix and a PET film may be stacked on the optical clear adhesive. In this manner, the stacked structure of the isolating member 1120a may be variously modified.

Thus, in the present example, the spacer 1120a may be replaced with the spacer 1120 illustrated in FIGS. 12A and 12B. In addition, various modified examples of the spacer described in the present disclosure may be replaced unless impossible.

In another example, referring to FIG. 14B, the semiconductor light emitting device may include white light emitting devices W in which a yellow phosphor layer is provided in every individual device. In this case, a phosphor layer may be formed on an upper surface of each of the white light emitting devices W. Also, in order to form unit pixels, a red phosphor layer 1081, a green phosphor layer 1082, and a blue phosphor layer 1083 may be provided on the white light emitting devices W.

Also, unit pixels may be formed by using repeated red, green, and blue color filters on the white light emitting devices W.

Meanwhile, even in this case, in order to increase contrast and reflect external light, the display unit 1000a may further include the black matrix 1091 disposed between a plurality of rows of the semiconductor light emitting devices. The black matrix 1091 may be disposed between the red phosphor layer 1081, the green phosphor layer 1082, and the blue phosphor layer 1083, and even in this structure, like the structure as described above, the X electrode 1110 of the touch sensor 1100 may be disposed in a position where the black matrix 1091 is disposed. Thus, the X electrode 1110 of the touch sensor 1100 may be positioned between the red phosphor layer 1081, the green phosphor layer 1082, and the blue phosphor layer 1083. Meanwhile, although not shown, when the black matrix 1091 is formed of a material that includes a black material having conductivity and has a resistance value appropriate for the X electrode 1110 of the touch sensor 1100 to be formed, the black matrix 1091 and the X electrode 1110 may be formed as a single layer and the black matrix 1091 may replace the role of the X electrode as described with reference to FIGS. 13A and 13B.

In another example, referring to FIG. 5C, the red phosphor layer 181, the green phosphor layer 182, and the blue phosphor layer 183 may be provided on the UV light emitting devices UV. In this manner, the semiconductor light emitting device may be used in the global region from a visible light to ultraviolet light UV, and extend to the form of a semiconductor light emitting device in which ultraviolet light UV is used as an excitation source of an upper phosphor.

In the exemplary embodiment, the semiconductor light emitting devices 150 are positioned on the conductive bonding layer 130 to form unit pixels in the display apparatus. Since the semiconductor light emitting devices 150 have excellent luminance, the semiconductor light emitting devices 150 may form individual unit pixels even with a small size. A length of one side of individual semiconductor light emitting device 150 may be 80 μm or smaller and the individual semiconductor light emitting device 150 may be a rectangular or square device. When the semiconductor light emitting device 150 has a rectangular shape, the semiconductor light emitting device 150 may have a size of 20×80 μm or smaller.

Also, even when a square semiconductor light emitting device 150 in which one side thereof is 10 μm is used as a unit pixel, sufficient brightness of the display apparatus can be obtained. Thus, in case of a rectangular pixel in which one side has a length of 600 μm and the other side is 300 μm, for example, distances between the semiconductor light emitting devices are sufficiently large, and thus, in this case, a flexible display apparatus having HD image quality can be implemented.

Meanwhile, even in this case, in order to increase contrast and reflect external light, the display unit 1000a may further include the black matrix 1091 disposed between a plurality of rows of the semiconductor light emitting devices. The black matrix 1091 may be disposed between the red phosphor layer 1081, the green phosphor layer 1082, and the blue phosphor layer 1083, and even in this structure, like the structure as described above, the X electrode 1110 of the touch sensor 1100 may be disposed in a position where the black matrix 1091 is disposed. Thus, the X electrode 1110 of the touch sensor 1100 may be positioned between the red phosphor layer 1081, the green phosphor layer 1082, and the blue phosphor layer 1083. Meanwhile, although not shown, when the black matrix 1091 is formed of a material that includes a black material having conductivity and has a resistance value appropriate for the X electrode 1110 of the touch sensor 1100 to be formed, the black matrix 1091 and the X electrode 1110 may be formed as a single layer and the black matrix 1091 may replace the role of the X electrode as described with reference to FIGS. 13A and 13B.

Various structures of one electrode of the touch sensor in the display unit 1000a will be described in detail with reference to the accompanying drawings. FIGS. 15A, 15B, 15C, and 15D are conceptual views illustrating various configurations in which electrodes of a touch sensor are disposed in a black matrix (or various structures of electrodes).

For example, as illustrated in FIG. 15A, one surface of the X electrode 1110a of the touch sensor 1100 may be stacked on the conductive bonding layer 1030 to face the conductive bonding layer 1030. In this case, a black matrix 1091a may be formed to cover other surfaces excluding one surface (a contact surface where the black matrix and the X electrode are in contact). According to this structure, the X electrode 1110a may not be in contact with phosphors. In this case, the width of the black matrix 1091a may be greater than that of the X electrode 1110a. The X electrode 1110a is covered by the black matrix 1091a and, in this case, the X electrode 1110a is not exposed outwardly.

In another example, as illustrated in FIG. 15B, one black matrix 1091b may include a plurality of X electrodes 1110b and 1110b'. Namely, electrode lines corresponding to the plurality of X electrodes 1110b and 1110b' may be disposed together in one black matrix 1091b. As illustrated, the plurality of X electrodes 1110b and 1110b' are disposed in both ends of one black matrix 1091b, and spaces between the plurality of X electrodes 1110b and 1110b' are filled with the black matrix 1091b. Also, the plurality of X electrodes 1110b and 1110b' are covered by the black matrix 1091b. For this structure, the black matrix 1091b has two layers with different widths.

In a specific configuration, one surface of each of the plurality of X electrodes 1110b and 1110b' may face the conductive bonding layer 1030, one of surfaces perpendicular to the one surface may face the phosphors 1080, and the other surfaces may be covered by the black matrix 1091b. In this case, a portion of one surface of the black matrix 1091b may be combined with the conductive bonding layer 1030 and the other remaining portions excluding the portion of the one surface of the black matrix 1091b may be in contact with the X electrodes 1110b and 1110b'. As illustrated, the X electrodes 1110b and 1110b' may be positioned in both ends of one surface of the black matrix 1091b.

In another example, as illustrated in FIG. 15C, an X electrode 1110c of the touch sensor 1100 may be disposed in an upper portion of a black matrix 1091c. In a specific example, a recess depressed toward the wiring board is formed on an upper surface of the black matrix 1091c, and the X electrode 1110c may be accommodated in the recess. The recess may be formed in a central portion of the black matrix 1091c, and thus, the width of the X electrode 1110c may be smaller than the black matrix 1091c.

However, the present disclosure is not limited thereto and the recess may be formed at any one of edges of the black matrix 1091c or in both edge portions of the black matrix 1091c. Recesses may be formed at both edges of the black matrix 1091c and a plurality of X electrodes 1110c may be stacked on the line of one black matrix 1091c.

Since the X electrode 1110c is accommodated in the recess, even though the X electrode 1110c is disposed in the upper portion of the black matrix 1091c, namely, even though one surface of the X electrode 1110c faces outwards, reflection of external light is not significant in the display apparatus.

In another example, as illustrated in FIG. 15D, an X electrode 1110d of the touch sensor 1100 may be disposed above a black matrix 1091d but not covered by the black matrix 1091d. In detail, the width of the X electrode 1110d is smaller than the black matrix 1091d and the X electrode 1110d forms a line on an upper surface of the black matrix 1091d. In this structure, the X electrode 1110d may be formed on the upper surface of the black matrix 1091d through plating, deposition, printing, or the like.

In another example, the X electrode 1110d may be formed on a lower surface of a spacer 1120d. Namely, the X electrode 1110d is formed on a lower surface of the spacer 1120d to form an electrode film, and the electrode film may cover an upper surface of the display unit. In this case, the spacer 1120d as an electrode film of the X electrode is stacked with the electrode 1140 including the Y electrode 1130. To this end, as illustrated, the black matrix 1091d is formed to have a height lower than the phosphor layer in a thickness direction of the display apparatus, and the electrode film of the X electrode may be formed to accommodate the X electrode 1110d in a space formed due to the height difference.

The structure of the display apparatus described above may also be applied to a vertical semiconductor light emitting device. Hereinafter, a vertical structure will be described with reference to FIGS. 16 and 17. FIG. 16 is a perspective view illustrating a display apparatus using a semiconductor light emitting device according to another exemplary embodiment of the present disclosure, and FIG. 17 is a cross-sectional view taken along line C-C of FIG. 16.

Referring to the drawings, the display apparatus may be a display apparatus using a passive matrix (PM) type vertical semiconductor light emitting device.

The display apparatus 1600 may include a display unit 1600a forming screen information by emitting R, G, and B light and a touch sensor 1700 sensing a touch input applied to the display apparatus 1600. Hereinafter, in the exemplary embodiment or the modified example described hereinafter, the like or similar reference numerals are given to components identical or similar to those of the former example, and redundant description thereof will be omitted.

The display apparatus 1600 includes a board 1610, a conductive bonding layer 1630, and a plurality of semiconductor light emitting devices 1650. Hereinafter, the descriptions of components of the present exemplary embodiment same as or similar to those of the exemplary embodiment illustrated in FIGS. 7 through 9 will be used as descriptions of the present exemplary embodiment, and only different parts will be mainly described.

The board 1610 is a wiring board and may be any one of flexible polyimide (PI), polyethylene naphthalate (PEN), and polyethylene terephthalate (PET) boards. Also, as in the former exemplary embodiment, a first electrode 1620 is formed on the board 1610. The conductive bonding layer 1630 is formed on a plane on which the first electrode 1620 is positioned. The conductive bonding layer 1630 may be an anisotropy conductive film (ACF), anisotropy conductive paste, or a solution containing conductive particles, for example. Hereinafter, a case in which the conductive bonding layer 1630 is formed by an anisotropic conductive film will be described.

The semiconductor light emitting devices 1650 may have a vertical structure and combined with the conductive bonding layer 1630. A plurality of second electrodes 1640 may be disposed between the vertical semiconductor light emitting devices 1650 in a direction crossing a length direction of the first electrode 1620 and positioned to be electrically connected to the semiconductor light emitting devices 1650. In this case, the second electrodes 1640 are disposed on the conductive bonding layer 1630.

For example, the first electrode 1620 and the second electrodes 1640 are disposed in mutually crossing directions, and as in the former exemplary embodiment, the first electrode 1620 may be a vertical electrode and the second electrodes 1640 may be horizontal electrodes.

As illustrated, the plurality of semiconductor light emitting devices 1650 constitute a semiconductor light emitting device array along a plurality of electrode lines 1621. Also, a phosphor may be staked along each of the plurality of electrode lines. Thus, in the first electrode 1620, one electrode line may be an electrode controlling a color. Thus, red (R), green (G), and blue (B) phosphors may be disposed in sequence along the second electrodes 1640, and thus, unit pixels may be implemented.

The plurality of semiconductor light emitting devices 1650 are combined with the conductive bonding layer 1630, forming a plurality of rows along at least one of the plurality of electrode lines.

As illustrated, the plurality of semiconductor light emitting devices 1650 may form a plurality of rows in a direction parallel to the plurality of electrode lines provided in the first electrode 1620. However, the present disclosure is not limited thereto.

In addition, the display unit 1600a may further include a phosphor layer 1680 formed on one surface of the plurality of semiconductor light emitting devices 1650. For example, the semiconductor light emitting device 1650 may be a blue semiconductor light emitting device emitting blue (B) light, and the phosphor layer 1680 serves to convert the blue (B) light into a color of a unit pixel. The phosphor layer 1680 may be a red phosphor 1681 or a green phosphor 1682 constituting an individual pixel. Namely, in a position forming a red unit pixel, the red phosphor 1681 capable of converting blue light into red (R) light may be stacked on the blue semiconductor light emitting device 1650, and in a position forming a green unit pixel, the green phosphor 1682 capable of converting blue light into green (G) light may be stacked on the blue semiconductor light emitting device 1650. Also, in a portion forming a blue unit pixel, only the blue semiconductor light emitting device 1650 may be used alone. In this case, the red (R), green (G), and blue (B) unit pixels may constitute a single pixel, respectively. In detail, a phosphor of one color may be stacked along each line of the first electrode 1620. Thus, one line of the first electrode 1620 may be an electrode controlling one color. However, the present disclosure is not limited thereto and the semiconductor light emitting devices 1650 and quantum dots (QD), instead of phosphors, may be combined with form unit pixels emitting red (R), green (G), and blue (B).

Meanwhile, in order to increase contrast of the phosphor layer 1680, the display unit 1600a may further include a black matrix 1691 disposed between phosphors. The black matrix 1691 may absorb reflection of external light and increase the contrast. The black matrix 1691 is positioned between the phosphor layers 1680 along the first electrode 1620 in a direction in which the phosphor layers 1680 are stacked.

The touch sensor 1700 operating cooperatively with the display unit 1600a including the configuration as described above includes an X electrode 1710, a Y electrode 1730 stacked on the display unit, and a spacer 1720 separating the X and Y electrodes 1710 and 1730. The X and Y electrodes 1710 and 1730 are arranged in directions in which they cross each other, and receive electric charges from a power supply unit (not shown). Thus, in a state in which a potential difference is formed between the X and Y electrodes 1710 and 1730, when the display apparatus 1600 is touched with a conductor, for example, a user's finger, or the like, quantities of electric charge charged in the X and Y electrodes 1710 and 1730 are changed, respectively. Based on the change in the quantities of electric charges, the controller (not shown) may calculate positions of an X axis and a Y axis, and a touched input point may be specified by the calculation value. Meanwhile, in the present disclosure, the X electrode and the Y electrode are relative concepts, rather than having a general meaning of the terms. Thus, the X electrode is not necessarily identical to an X-axis direction and the Y electrode is not necessarily identical to an Y-axis direction. Namely, When any one of the X electrode and the Y electrode is in the X-axis direction, the other may be in the Y-axis direction.

Positions of the X electrode 1710 and the Y electrode 1730 of the touch sensor 1700 in the display apparatus 1600 will be described in detail. As illustrated, the X electrode 1710 of the touch sensor 1700 is disposed between the semiconductor light emitting devices 1650 forming a plurality of rows along the first electrode 1610 in the display unit 1100a. In detail, as illustrated in FIG. 17, the X electrode 1710 may be disposed between the plurality of rows on the conductive bonding layer 1630.

The X electrode 1710 includes a plurality of electrode lines, and the plurality of electrode lines of the X electrode 1710 are disposed to be separated in a horizontal direction between the semiconductor light emitting devices 1650 forming the plurality of rows. Thus, in the display apparatus using the vertical semiconductor light emitting devices, the X electrode 1710 may be positioned in the position of the black matrix 1691 (between the phosphor layers or between the semiconductor light emitting devices). In a case in which the X electrode 1710 is disposed in the position of the black matrix 1691, the X electrode 1710 may be formed to be covered by the black matrix 1691 or may cover the black matrix 1691.

In this manner, since the electrodes 1710 and the black matrix 1691 overlap, the black matrix 1691 and the X electrode 1710 may be positioned together between the phosphor layers in the display apparatus using vertical semiconductor light emitting devices.

In addition, the X electrode 1710 of the touch sensor 1700 may be positioned inside the display unit 1600a, while the Y electrode 1730 of the touch sensor 1700 may be positioned outside the display unit 1600a. In the present exemplary embodiment, as positions, shapes, functions, and structures of the X electrode 1710 and the Y electrode 1730, the electrode film 1740, and the spacer 1720 of the touch sensor 1700, those of the X electrode 1110 and the Y electrode 1130, the electrode film 1140, and the spacer 1120 of the display apparatus employing the flipchip type light emitting device described above with reference to FIGS. 12A and 12B are applied, and descriptions thereof will replace with the descriptions of the former exemplary embodiment.

As described above, in the display apparatus 1600 according to an exemplary embodiment of the present disclosure, by positioning any one of the X electrode 1710 and the Y electrode 1720 forming the touch sensor 1700 in the display unit 1600a, a thickness of the touch sensor 1700 in a Z-axis direction can be reduced.

Meanwhile, the black matrix 1691 as described above may be formed of a material having a resistance value different from that of the X electrode 1110 and including a black material. Also, the black material 1691 may be formed of a material having conductivity. Thus, in a case in which the black matrix 1691 has a resistance value different from that of one electrode of the touch sensor 1700, as illustrated in FIGS. 16 and 17, the X electrode 1710 and the black matrix 1691 may be stacked at corresponding positions.

For example, when the black matrix 1691 is formed of a material including a black material and having a resistance value appropriate for the X electrode 1710 of the touch sensor 1700 to be formed, as illustrated in FIGS. 13A and 13B, the X electrode 1710 of the touch sensor 1700 and the black matrix 1691 may be formed as a single layer. In this manner, one electrode of the touch sensor may serve as both an electrode and a black matrix. Thus, in this case, the black matrix may be both a component of the display unit and a component of the touch sensor.

Hereinafter, another example of a structure of a touch sensor disposed in a display unit will be described in detail with reference to the accompanying drawings. FIG. 18 is a perspective view illustrating a display apparatus using a semiconductor light emitting device according to another exemplary embodiment of the present disclosure, and FIGS. 19A and 19B are cross-sectional views taken along line B-B and C-C of FIG. 18.

As illustrated in FIGS. 18, 19A, and 19B, the display apparatus 1000 using a passive matrix (PM) type semiconductor light emitting device is illustrated as a display apparatus 1800 using a semiconductor light emitting device. However, the present disclosure described hereinafter may also be applied to an active matrix (AM) type semiconductor light emitting device.

The display apparatus 1800 may include a display unit 1800a forming screen information by emitting R, G, and B light and a touch sensor 1900 sensing a touch input applied to the display apparatus 1800. Hereinafter, in the exemplary embodiment or the modified example described hereinafter, the like or similar reference numerals are given to components identical or similar to those of the former example, and redundant description thereof will be omitted.

The display unit 1800a includes a board 1810, a first electrode 1820, a conductive bonding layer 1830, a second electrode 1840, and a plurality of semiconductor light emitting devices 1850. Here, the first electrode 1820 and the second electrode 1840 may include a plurality of electrode lines, respectively.

The board 1810 may be a wiring board on which a plurality electrode lines included in the first electrode 1820 are disposed, and thus, the first electrode 1820 may be positioned on the board 1810. Also, the second electrode 1840 is disposed on the board 1810. For example, the board 1810 may be a wiring board including a plurality of layers, and the first electrode 1820 and the second electrode 1840 may be formed on each of the plurality of layers. In this case, the wiring board may be a board in which the board 110 and the insulating layer 160 of the display apparatus described above with reference to FIGS. 3A and 3B are integrally formed of a material having insulating properties and flexibility such as polyimide (PI), PET, PEN, or the like.

As illustrated, the first electrode 1820 and the second electrode 1830 are electrically connected to a plurality of semiconductor light emitting devices 1850. In this case, the first electrode 1820 may be connected to the plurality of semiconductor light emitting devices 1850 by the medium of an auxiliary electrode 1870 disposed to be coplanar with the second electrode 1830. The first electrode 1820 and the second electrode 1840 may be electrically connected to the plurality of semiconductor light emitting devices 1850 by a conductive bonding layer 1830 disposed on one surface of the board 1810.

The conductive bonding layer 1830 may be a layer having adhesion and conductivity, and to this end, the conductive bonding layer 1830 may be formed of a mixture of a material having conductivity and a material having adhesion. Also, the conductive bonding layer 1830 may have ductility to enable the display apparatus to have a flexible function. In a state in which the auxiliary electrode 1870 and the second electrode 1840 are positioned, the conductive bonding layer 1830 is formed, and thereafter, when the semiconductor light emitting devices 1850 are connected in a flipchip manner by applying heat and pressure thereto, the semiconductor light emitting devices 1850 are electrically connected to the first electrode 1820 and the second electrode 1840.

In this manner, the plurality of semiconductor light emitting devices 1850 are coupled to the conductive bonding layer 1830, forming a plurality of rows along at least one of the plurality of electrode lines. As illustrated, the plurality of semiconductor light emitting devices 1850 may form a plurality of rows in a direction parallel to the plurality of electrode lines provided in the first electrode 1820. However, the present disclosure is not limited thereto, and for example, the plurality of semiconductor light emitting devices 1850 may form a plurality of rows along the second electrode 1840.

In addition, the display unit 1800a may further include a phosphor layer 1880 formed on one surface of the plurality of semiconductor light emitting devices 1850. For example, the semiconductor light emitting device 1850 may be a blue semiconductor light emitting device emitting blue (B) light, and the phosphor layer 1880 serves to convert the blue (B) light into a color of a unit pixel. The phosphor layer 1880 may be a red phosphor 1881 or a green phosphor 1882 constituting an individual pixel. Namely, in a position forming a red unit pixel, the red phosphor 1881 capable of converting blue light into red (R) light may be stacked on the blue semiconductor light emitting device 1850, and in a position forming a green unit pixel, the green phosphor 1882 capable of converting blue light into green (G) light may be stacked on the blue semiconductor light emitting device 1850. Also, in a portion forming a blue unit pixel, only the blue semiconductor light emitting device 1850 may be used alone. In this case, the red (R), green (G), and blue (B) unit pixels may constitute a single pixel, respectively. In detail, a phosphor of one color may be stacked along each line of the first electrode 1820. Thus, one line of the first electrode 1820 may be an electrode controlling one color. Namely, the red (R), green (G), and blue (B) phosphors may be disposed in sequence along the second electrode 1840, thus forming unit pixels. However, the present disclosure is not limited thereto and the semiconductor light emitting devices 1850 and quantum dots (QD), instead of phosphors, may be combined with form unit pixels emitting red (R), green (G), and blue (B).

Meanwhile, in order to increase contrast of the phosphor layer 1880, the display unit 1800a may further include a black matrix 1891 disposed between phosphors. The black matrix 1891 may absorb reflection of external light and increase the contrast. The black matrix 1891 is positioned between the phosphor layers 1880 along the first electrode 1820 in a direction in which the phosphor layers 1880 are stacked.

According to an exemplary embodiment of the present disclosure, any one of the first and second electrodes 1820 and 1840 may be an X electrode or a Y electrode of the touch sensor 1900. For example, the touch sensor 1900 may utilize any one of the first and second electrodes 1820 and 1840 of the display unit 1800a, as an X electrode. Hereinafter, in the present exemplary embodiment, any one of the first and second electrodes 1820 and 1840 is utilized as an X electrode, but any one of the first and second electrodes 1820 and 1840 may become the Y electrode.

The touch sensor 1900 includes the Y electrode 1930 and a spacer 1920 stacked on the display unit. Thus, the Y electrode 1930 may be arranged in a direction crossing any one of the first and second electrodes 1820 and 1840. As illustrated, among the first and second electrodes 1820 and 1840, the first electrode 1820 is utilized as an X electrode of the touch sensor 1900.

Thus, the touch sensor 1900 may sense a touch input based on a change in a quantity of electric charge between any one (i.e., the first electrode) among the first and second electrodes 1820 and 1840 and the Y electrode 1930.

The controller (not shown) of the display apparatus 1800 controls the semiconductor light emitting devices 1850 through a first signal transmission line formed by the first and second electrodes 1820 and 1840, and processes the sensed touch input through a second signal transmission line formed by the first electrode 1820 and the Y electrode 1930. Namely, a driving signal of the semiconductor light emitting devices 1850 may be generated by generating a first potential difference between the first and second electrodes 1820 and 1840, and sensing of a touch input by the touch sensor 1900 may be generated due to a change in a second potential difference formed through a second signal transmission line formed by the first electrode 1820 and the Y electrode 1930. However, the present disclosure is not limited thereto and the second signal transmission line may be a signal transmission line formed by combining the second electrode 1840 and the Y electrode 1930.

In this manner, in the present exemplary embodiment, by positioning one electrode of the touch sensor 1900 inside the display unit 1800a, a thickness of the touch sensor 1900 may be reduced. Also, the Y electrode 1930 of the touch sensor 1900 may be positioned outside the display unit 1800a. As illustrated, the Y electrode 1930 is disposed to overlap the plurality of semiconductor light emitting devices 1850 outside the display unit 1800a and combined with the first electrode 1820 to sense a touch input.

The Y electrode 1930 may be formed on an electrode film 1940 formed of a light-transmissive material allowing light emitted from the plurality of semiconductor light emitting devices 1850 to be transmitted therethrough. As illustrated, the Y electrode 1930 may protrude from one surface of the electrode film 1940 and may be formed inside the electrode film 1940. In a case in which the Y electrode 1930 is formed inside the electrode film 1940, the electrode film 1940 may be formed as a plurality of layers.

The spacer 1920 of the touch sensor 1900 may be formed as a light-transmissive member to allow light emitted from the plurality of semiconductor light emitting devices 1850 to be transmitted therethrough. The spacer 1920 is disposed between the electrode film 1940 and the plurality of semiconductor light emitting devices 1850. Like the spacer illustrated in FIGS. 12A and 12B or like the spacer illustrated in FIG. 14A, the spacer 1920 may be, for example, an optically clear adhesive (OCA) (or an optically clear adhesive film), a non-reflection film (or a low reflection film), a transparent resin, or the like. Also, the spacer 1920 may have a structure in which at least a pair of the OCA, the non-reflection film (or low-reflection film) and a transparent resin are stacked. Descriptions of the spacer 1920 will be replaced with the descriptions of the spacer illustrated in FIGS. 12A and 12B or the descriptions of the spacer illustrated in FIG. 14A.

Meanwhile, the controller may appropriately process signals such that a driving signal for driving the semiconductor light emitting devices 1850 and a change in a quantity of an electric charge of a touch input applied to the touch sensor 1900 are not affected each other although the semiconductor light emitting devices 1850 and the touch sensor 1900 share any one of the first and second electrodes 1820 and 1840.

For example, a case in which the Y electrode 1900 of the touch sensor 1900 forms a second signal transmission line with the second electrode 1820 of the display unit 1800a will be described together with FIG. 20. Here, the first electrode 1820 may be a data electrode and the second electrode 1840 may be a scan electrode. Also, Vd corresponds to a voltage applied to the first electrode 1820, and Vs1, Vs2, Vs3, . . . , Vn respectively correspond to voltages applied to a plurality of electrode lines included in the second electrode 1840. The semiconductor light emitting devices provided in the display unit 1800a are turned on based on potential differences formed between Vd and Vs1 and Vd and Vs2, Vs3, . . . , Vn.

For example, in a case in which a voltage $\Delta V$ is applied to both Vd and Vs1, since Vd and Vs1 do not have a potential difference therebetween, semiconductor light emitting devices electrically connected to electrodes corresponding to Vd and Vs1 are not turned on. When Vd and Vs1 has a potential difference as in a section 'a', since a potential difference is formed between Vd and Vs1, the semiconductor light emitting devices electrically connected to the electrodes corresponding to Vd and Vs1 are turned on. Thus, as illustrated, in the section 'a', the semiconductor light emitting devices electrically connected to the electrodes corresponding to Vd and Vs1 emit light, in a section 'b', semiconductor light emitting devices electrically connected to electrodes corresponding to Vd and Vs2 emit light, and in a section 'c', semiconductor light emitting devices electrically connected to electrodes corresponding to Vd and Vs3 emit light, and in a section 'd', semiconductor light emitting devices electrically connected to electrodes corresponding to Vd and Vsn emit light.

Meanwhile, in order not to be affected by a potential difference formed between Vd and Vs1, Vs2, Vs3, . . . , Vn, the touch sensor 1900 may be designed not to react with a change in a potential difference between 0 to $\Delta V$ as a reference potential to be formed between Vd and Vs1, Vs2, Vs3, . . . , Vn. Namely, the touch sensor 1900 may be designed to recognize a touch input when a potential higher than $\Delta V$ is sensed. To this end, a voltage higher than a magnitude of $\Delta V$ may be applied to the Y electrode, and an influence of a potential difference formed between Vd and Vs1, Vs2, Vs3, . . . , Vn may be processed as noise in detecting a touch input.

Thus, the display apparatus 1800 may be designed such that a first potential difference between the first and second electrodes 1820 and 1840 related to driving of the semiconductor light emitting devices 1850 is lower than a second potential difference formed between the second electrode 1840 and the Y electrode to sense a touch input. Accordingly, an influence (for example, the second potential difference is increased or decreased by the first potential difference) of the generation of the first potential difference on the second potential difference may be processed as noise in detecting the touch input.

Here, a magnitude of voltages applied to the first and second electrodes 1820 and 1840 may be lower than that of a voltage applied to the Y electrode 1930.

A method for appropriately processing a signal such that a driving signal for driving the semiconductor light emitting devices 1850 and a change in a quantity of electric charge of a touch input applied to the touch sensor 1900 are not affected each other even though the semiconductor light emitting devices 1850 and the touch sensor 1900 share any one of the first and second electrodes 1820 and 1840 will be described as another example.

Here, Vd corresponds to a voltage applied to the first electrode 1820, and Vs1, Vs2, Vs3, . . . , Vn respectively correspond to voltages applied to a plurality of electrode lines included in the second electrode 1840. The semiconductor light emitting devices provided in the display unit 1800a are turned on based on potential differences formed between Vd and Vs1 and Vd and Vs2, Vs3, . . . , Vn. For example, in a state in which a voltage having a predetermined magnitude is applied to Vd, when a minus voltage is applied to any one of Vs1, Vs2, Vs3, . . . , Vn to allow the any one to have a potential of $\Delta V$, semiconductor light emitting devices electrically connected to Vd and the any one of Vs1, Vs2, Vs3, . . . , Vn may be turned on. In this case, as the minus voltage is applied in a state in which a voltage is not applied to Vs1, Vs2, Vs3, . . . , Vn (in a state in which voltage 0V is applied), $\Delta V$ may be generated.

Thus, in a section 'a' in which the voltage $\Delta V$ is applied to Vs1, the semiconductor light emitting devices electrically connected to the electrodes corresponding to Vd and Vs1 emit light, in a section 'b', semiconductor light emitting devices electrically connected to electrodes corresponding to Vd and Vs2 emit light, and in a section 'c', semiconductor light emitting devices electrically connected to electrodes corresponding to Vd and Vs3 emit light, and in a section 'd', semiconductor light emitting devices electrically connected to electrodes corresponding to Vd and Vsn emit light.

Meanwhile, in order not to be affected by formation of a potential difference with Vd as a voltage is applied to the second electrode 1840, namely, to Vs1, Vs2, Vs3, . . . , Vn, the touch sensor 1900 may be designed such that a potential of the Y electrode is changed to be identical to the potential of Vs1, Vs2, Vs3, . . . , Vn electrodes. Namely, in the touch sensor 1900, a potential of the Y electrode 1930 may be changed when a potential of the second electrode 1840 is changed, such that a potential difference between Vs1, Vs2, Vs3, . . . , Vn and the Y electrode 1930 is maintained. For example, as illustrated, a change in potentials of the second electrode 1840, namely, Vs1, Vs2, Vs3, . . . , Vn and the Y electrode are generated in the form of a pulse, respectively, and a point in time at which the pulse is generated and a magnitude of the pulse may be generated in the same manner in the touch sensor and the display unit. Thus, potentials of the second electrode 1840 and the Y electrode 1930 may be generated at the same time and with magnitude.

As described above, according to an exemplary embodiment of the present disclosure, by utilizing any one of the first and second electrodes of the display unit, as an electrode of the touch sensor, a thickness of the touch sensor can be reduced.

So far, the case in which the display unit 1800*a* includes the blue semiconductor light emitting device that emit blue (B) light has been described, but the present disclosure is not limited thereto and any other structure implementing blue, red, and green may be applied. FIGS. 22A, 22B, and 22C are conceptual views illustrating various configurations implementing color in relation to a flipchip type semiconductor light emitting device to which the present invention is applied and various types of stacked structures for implementing touch sensors.

Descriptions of the configuration of the display unit 1800*a* illustrated in FIGS. 22A, 22B, and 22C will be replaced with the descriptions of FIGS. 5A, 5B, and 5B. As illustrated, in the display apparatus 1800, any one of the first electrode 1820 and the second electrode 1840 of the display unit 1800*a* including a blue semiconductor light emitting device that emits blue (B) light and other semiconductor light emitting device, may be utilized as an electrode of the touch sensor 1900. In the display apparatus 1800, the touch sensor 1900 includes the Y electrode 1930 and the spacer 1920, and the spacer 1920 may be stacked on the display unit 1800*a* or the phosphor layer. Thus, the touch sensor 1900 may sensed a touch input based on a change in a quantity of electric charge between any one of the first and second electrodes 1820 and 1840 and the Y electrode 1930.

Meanwhile, in the display apparatus according to an exemplary embodiment of the present disclosure, by utilizing any one of the first and second electrodes of the display unit as an X electrode of the touch sensor and by positioning the Y electrode between the semiconductor light emitting devices forming a plurality of rows, both the X and Y electrodes of the touch sensor may be positioned in the display unit.

FIG. 23 is a cross-sectional view illustrating a structure in which electrodes of the touch sensor are disposed on the display unit of the display apparatus of FIG. 18. As illustrated, the display unit 1800*a* includes the first electrode 1820 and the second electrode 1840 electrically connected to the plurality of semiconductor light emitting devices 1850 and arranged in mutually crossing directions, and any one of the first electrode 1820 and the second electrode 1840 may be formed to have a potential difference with respect to the Y electrode 1930 such that the any one of the first electrode 1820 and the second electrode 1840 becomes an X electrode of the touch sensor 1900. The Y electrode 1930 is disposed between the plurality of semiconductor light emitting devices 1850 arranged to form a plurality of rows and combined with any one of the first electrode 1820 and the second electrode 1840 to sense a touch input.

In a position where the black matrix 1891 is disposed, the Y electrode 1930 may be stacked on the black matrix 1891. The Y electrode 1930 may be stacked to be in contact with the conductive bonding layer 1830 and may be covered by the back matrix 1891. Meanwhile, an electrode structure of the touch sensor 1900 and the black matrix 1891 may be combined variously, and detailed descriptions thereof will be replaced with the descriptions of FIGS. 15A, 15B, 15C, and 15D. Also, when both the X electrode and Y electrode 1930 of the touch sensor 1900 are positioned in the display unit 1800*a*, the X electrode and Y electrode 1930 may be spaced by at least any one of the conductive bonding layer 1830 and the insulating layer 1860 of the display unit 1800*a*.

Since any one of the first electrode 1820 and the second electrode 1840 becomes an X electrode of the touch sensor 1900, the Y electrode 1930 of the touch sensor 1900 forms a second signal transmission line with any one of the first electrode 1820 and the second electrode 1840, for sensing a touch. In this case, the signal processing scheme described above with reference to FIGS. 20 and 21 may be employed to perform signal processing, and detailed descriptions thereof will be replaced with the description of FIGS. 20 and 21.

Thus, in this case, all the components for forming the touch sensor may be positioned on the display unit 1800*a*, and thus, a thickness of the display apparatus in the Z axis direction can be significantly reduced.

Hereinafter, another example of the structure of the touch sensor disposed in the display unit will be described in detail with reference to the accompanying drawings. FIG. 24 is a perspective view illustrating a display apparatus using a semiconductor light emitting device according to another exemplary embodiment of the present disclosure, FIG. 25 is a cross-sectional view taken along line C-C of FIG. 16, and FIG. 26 is a cross-sectional view illustrating a structure in which electrodes of the touch sensor is disposed on a display unit of the display apparatus of FIG. 24.

Referring to FIGS. 24 and 25, a display apparatus using a passive matrix (PM) type vertical semiconductor light emitting device is illustrated as a display apparatus 2400 using a semiconductor light emitting device. However, the present disclosure described hereinafter may also be applied to an active matrix (AM) type semiconductor light emitting device.

Descriptions of the configuration and structure of the display unit 1800*a* illustrated in FIGS. 24 and 25 will be replaced with the descriptions of FIGS. 16 and 17 as discussed above.

As illustrated, even when the passive matrix (PM) type vertical semiconductor light emitting device is used in the display apparatus 2400, any one of first and second electrodes 2420 and 2440 included in the display apparatus 2400 may be utilized as an X electrode of a touch sensor 2500. The touch sensor 2500 includes an Y electrode 2530 and a spacer 2520 stacked on the display unit 2400*a*. thus, the Y electrode 2530 may be arranged in a direction crossing any one of the first and second electrodes 2420 and 2440. As illustrated, among the first and second electrodes 2420 and 2440, the first electrode 2420 is utilized as an X electrode of the touch sensor 2500.

Thus, the touch sensor 2500 may sense a touch input based on a change in a quantity of an electric charge between any one of the first and second electrodes 2420 and 2440 and the Y electrode 2530. Descriptions of signal processing and controlling of the display unit 2400*a* and the touch sensor 2500 in a case in which any one of the electrodes of the display unit 2400*a* is used as an electrode of the touch sensor 2500 will be replaced with the descriptions of FIGS. 18, 19A, 19*b*, 21, and 22 as discussed above.

Meanwhile, in the display apparatus according to an exemplary embodiment of the present disclosure, as illustrated in FIG. 26, by utilizing any one of first and second electrodes of the display unit, as an X electrode of the touch sensor, and positioning the Y electrode of the touch sensor between the vertical semiconductor light emitting devices forming a plurality of rows, both the X and Y electrodes of the touch sensor may be positioned in the display unit.

FIG. 26 is a cross-sectional view illustrating a structure in which electrodes of the touch sensor are disposed on the display unit of the display apparatus described above with reference to FIG. 24. As illustrated, the display unit 2400a includes the first electrode 2420 and the second electrode 2440 electrically connected to the plurality of semiconductor light emitting devices 2450 and arranged in mutually crossing directions, and any one of the first electrode 2420 and the second electrode 2440 may be formed to have a potential difference with respect to the Y electrode 2530 such that the any one of the first electrode 2420 and the second electrode 2440 becomes an X electrode of the touch sensor 2500. The Y electrode 2530 is disposed between the plurality of semiconductor light emitting devices 2450 arranged to form a plurality of rows and combined with any one of the first electrode 2420 and the second electrode 2440 to sense a touch input. In a position where the black matrix 2491 is disposed, the Y electrode 2530 may be stacked on the black matrix 2491. Meanwhile, an electrode structure of the touch sensor 2500 and the black matrix 2491 may be combined variously, and detailed descriptions thereof will be replaced with the descriptions of FIGS. 15A, 15B, 15C, and 15D. Also, in this case, the signal processing scheme described above with reference to FIGS. 20 and 21 may be employed to perform signal processing and controlling to sense a touch, and detailed descriptions thereof will be replaced with the description of FIGS. 20 and 21.

Also, when both the X electrode and Y electrode 2530 of the touch sensor 2500 are positioned in the display unit 2400a, the X electrode and Y electrode 2530 may be spaced by at least any one of the conductive bonding layer 2430 and the insulating layer 2460 of the display unit 2400a. Thus, in this case, since all the components for forming the touch sensor may be positioned on the display unit 2400a, a thickness of the display apparatus in the Z axis direction can be significantly reduced.

Also, since the X electrode and the Y electrode of the touch sensor are not formed on electrode films such as ITO films, damage to the electrode films in the touch sensor may be prevented or alleviated when the flexible display apparatus is bent.

The display apparatus using a semiconductor light emitting device described above is not limited to the configurations and methods of the exemplary embodiments described above, but the entirety or a portion of the embodiments can be selectively combined with be configured into various modifications.

The foregoing exemplary embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described exemplary embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

The invention claimed is:

1. A display apparatus including a touch sensor unit and a display unit controlled based on a touch input sensed through the touch sensor unit, wherein the display unit comprises:
   a conductive bonding layer; and
   a plurality of semiconductor light emitting devices combined with the conductive bonding layer and arranged to form a plurality of rows, and
   the touch sensor unit comprises:
   an X electrode disposed between the plurality of rows of the plurality of semiconductor light emitting devices in the display unit;
   an Y electrode configured to be combined with the X electrode to sense a touch input, a plurality of horizontal electrode lines electrically connected to the plurality of semiconductor light emitting devices; and
   a plurality of vertical electrode lines arranged in a direction crossing the plurality of horizontal electrode lines and disposed to be parallel to the X electrode.

2. The display apparatus of claim 1, further comprising:
   a black matrix disposed to cover the X electrode between the plurality of semiconductor light emitting devices.

3. The display apparatus of claim 2, wherein phosphor layers are formed on one surfaces of the plurality of semiconductor light emitting devices, and the black matrix and the X electrode are positioned between the phosphor layers, respectively.

4. The display apparatus of claim 2, wherein the X electrode is disposed between the conductive bonding layer and the black matrix.

5. The display apparatus of claim 2, wherein the X electrode and the black matrix are formed of materials having different resistance values, respectively.

6. The display apparatus of claim 1, wherein the X electrode is formed as being black to alleviate reflection between the phosphor layers provided in the display unit.

7. The display apparatus of claim 6, wherein the X electrode is formed as a single layer between the phosphor layers.

8. The display apparatus of claim 1, wherein the X electrode is disposed inside the display unit, the Y electrode is formed on an electrode film formed of a light-transmissive material allowing light emitted from the plurality of semiconductor light emitting devices to be transmitted therethrough, and the electrode film is disposed to overlap the plurality of semiconductor light emitting devices outside the display unit.

9. The display apparatus of claim 8, wherein a light-transmissive member is disposed between the electrode film and the plurality of semiconductor light emitting devices to space the X and Y electrodes and allow light from the semiconductor light emitting devices to be transmitted therethrough.

10. The display apparatus of claim 1, wherein the plurality of horizontal electrode lines and the plurality of vertical electrode lines are formed on a wiring board covered by the conductive bonding layer.

11. The display apparatus of claim 1, wherein the display unit comprises a vertical electrode and a horizontal electrode electrically connected to the plurality of semiconductor light emitting devices and arranged in mutually crossing directions, and any one of the vertical electrode and the horizontal electrode has a potential difference from the X electrode such that the any one of the vertical electrode and the horizontal electrode becomes a Y electrode of the touch sensor unit.

12. The display apparatus of claim 11, wherein the touch sensor unit senses a touch input through a signal transmission line formed between any one of the vertical electrode and the horizontal electrode and the X electrode.

* * * * *